United States Patent
Frosien et al.

(10) Patent No.: US 10,177,048 B2
(45) Date of Patent: Jan. 8, 2019

(54) SYSTEM FOR INSPECTING AND REVIEWING A SAMPLE

(71) Applicant: APPLIED MATERIALS ISRAEL LTD., Rehovot (IL)

(72) Inventors: Juergen Frosien, Riemerling (DE); Jacob Levin, Rehovot (IL); Igor Krivts (Krayvitz), Rehovot (IL); Yoram Uziel, Misgav (IL); Boris Golberg, Ashdod (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 14/639,003

(22) Filed: Mar. 4, 2015

(65) Prior Publication Data

US 2016/0260642 A1    Sep. 8, 2016

(51) Int. Cl.
*H01J 37/20*    (2006.01)
*H01L 21/66*    (2006.01)
*H01J 37/22*    (2006.01)
*H01J 37/26*    (2006.01)
*H01J 37/29*    (2006.01)

(52) U.S. Cl.
CPC ............ *H01L 22/12* (2013.01); *H01J 37/228* (2013.01); *H01J 37/265* (2013.01); *H01J 37/292* (2013.01); *H01J 2237/2817* (2013.01)

(58) Field of Classification Search
CPC . H01L 22/12; H01J 37/18; H01J 37/20; H01J 37/22; H01J 37/228; H01J 37/28; H01J 37/292
See application file for complete search history.

(56) References Cited

U.S. PATENT DOCUMENTS

| | | |
|---|---|---|
| 6,208,751 B1 | 3/2001 | Almogy |
| 6,630,995 B1 | 10/2003 | Hunter |
| 6,952,653 B2 | 10/2005 | Toth et al. |
| 7,106,434 B1 * | 9/2006 | Mapoles ............ G01R 31/2894 356/237.5 |
| 7,428,850 B2 | 9/2008 | Naftali et al. |

(Continued)

OTHER PUBLICATIONS

Hafner, Bob. "Scanning electron microscopy primer." Characterization Facility, University of Minnesota—Twin Cities (2007): 1-29.*

*Primary Examiner* — Wyatt Stoffa
(74) *Attorney, Agent, or Firm* — Kilpatrick Townsend & Stockton LLP

(57) ABSTRACT

A system for inspecting and reviewing a sample, the system may include a chamber that is arranged to receive the sample and to maintain vacuum within the chamber during at least a scan period; an inspection unit; a review unit; and a mechanical stage for moving the sample, according to a scan pattern and during the scan period, in relation to the inspection unit and the review unit while a spatial relationship between the inspection unit and the review unit remains unchanged; wherein the inspection unit is arranged to detect, during the scan period, multiple suspected defects of the sample; and wherein the review unit is arranged to (a) receive, during the scan period, information about the multiple suspected defects; and (b) locate, during the scan period and in response to the information about the multiple suspected defects, at least one actual defect.

19 Claims, 19 Drawing Sheets

(56) References Cited

U.S. PATENT DOCUMENTS

| | | | | |
|---|---|---|---|---|
| 2004/0232332 | A1* | 11/2004 | Konno | H01J 37/265 250/310 |
| 2005/0199807 | A1* | 9/2005 | Watanabe | G01R 31/305 250/306 |
| 2005/0200841 | A1* | 9/2005 | Talbot | G06T 7/0004 356/237.4 |
| 2005/0236569 | A1* | 10/2005 | Yamaguchi | H01J 37/265 250/311 |
| 2007/0057184 | A1* | 3/2007 | Uto | G01N 21/95607 250/310 |
| 2007/0200569 | A1* | 8/2007 | Watanabe | G01R 31/305 324/754.22 |
| 2009/0218509 | A1* | 9/2009 | Ito | H01J 37/20 250/442.11 |
| 2009/0309022 | A1* | 12/2009 | Gunji | G01N 23/2251 250/307 |
| 2011/0194101 | A1* | 8/2011 | Tachizaki | G01N 21/9501 356/72 |
| 2012/0001070 | A1* | 1/2012 | Takagi | G02B 21/0004 250/310 |
| 2012/0074316 | A1* | 3/2012 | Watanabe | H01J 37/265 250/307 |
| 2012/0074319 | A1* | 3/2012 | Nishiyama | G01N 23/225 250/307 |
| 2012/0233542 | A1* | 9/2012 | Funakoshi | H01L 22/12 715/243 |
| 2012/0274931 | A1* | 11/2012 | Otani | G01N 21/21 356/237.3 |
| 2013/0167665 | A1* | 7/2013 | Niibori | G01N 1/286 73/863.01 |
| 2013/0228685 | A1* | 9/2013 | Obara | H01J 37/222 250/310 |
| 2013/0284593 | A1* | 10/2013 | Shichi | H01J 27/10 204/298.03 |
| 2013/0284924 | A1* | 10/2013 | Mizuochi | G01N 23/2206 250/310 |
| 2014/0014848 | A1* | 1/2014 | Hatakeyama | G01N 23/2251 250/393 |
| 2014/0091215 | A1* | 4/2014 | Watanabe | H01J 37/265 250/307 |
| 2014/0204194 | A1* | 7/2014 | Otani | G01B 11/00 348/79 |
| 2014/0301630 | A1 | 10/2014 | Kulkarni et al. | |
| 2015/0083908 | A1* | 3/2015 | Ominami | H01J 37/16 250/307 |
| 2015/0116712 | A1* | 4/2015 | Otani | G01N 21/21 356/364 |
| 2015/0330912 | A1* | 11/2015 | Gosain | G01N 21/8851 356/237.2 |
| 2015/0377921 | A1* | 12/2015 | Ukraintsev | G01Q 30/02 324/750.02 |
| 2016/0047752 | A1* | 2/2016 | Ahn | G01N 21/9501 356/364 |

* cited by examiner

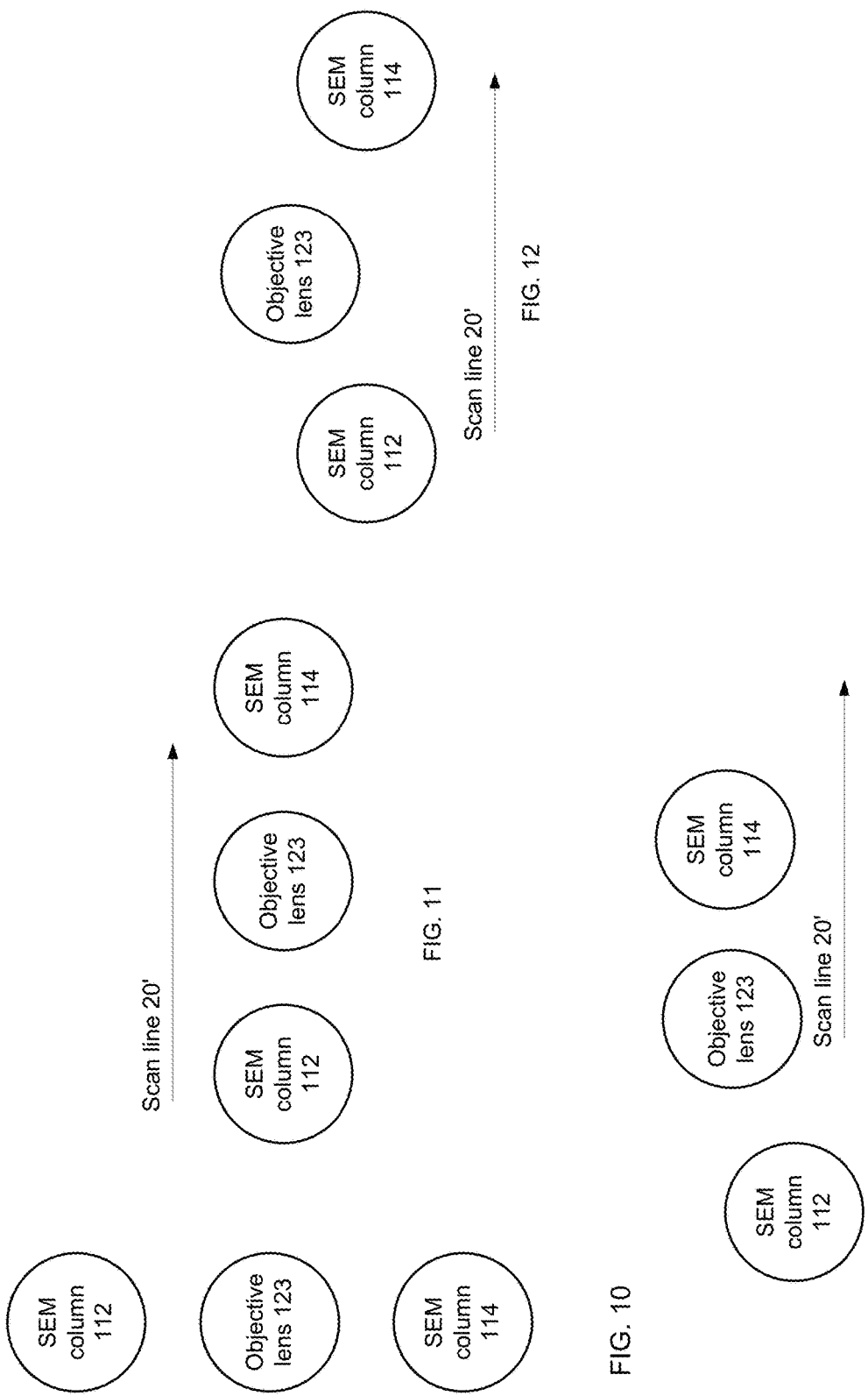

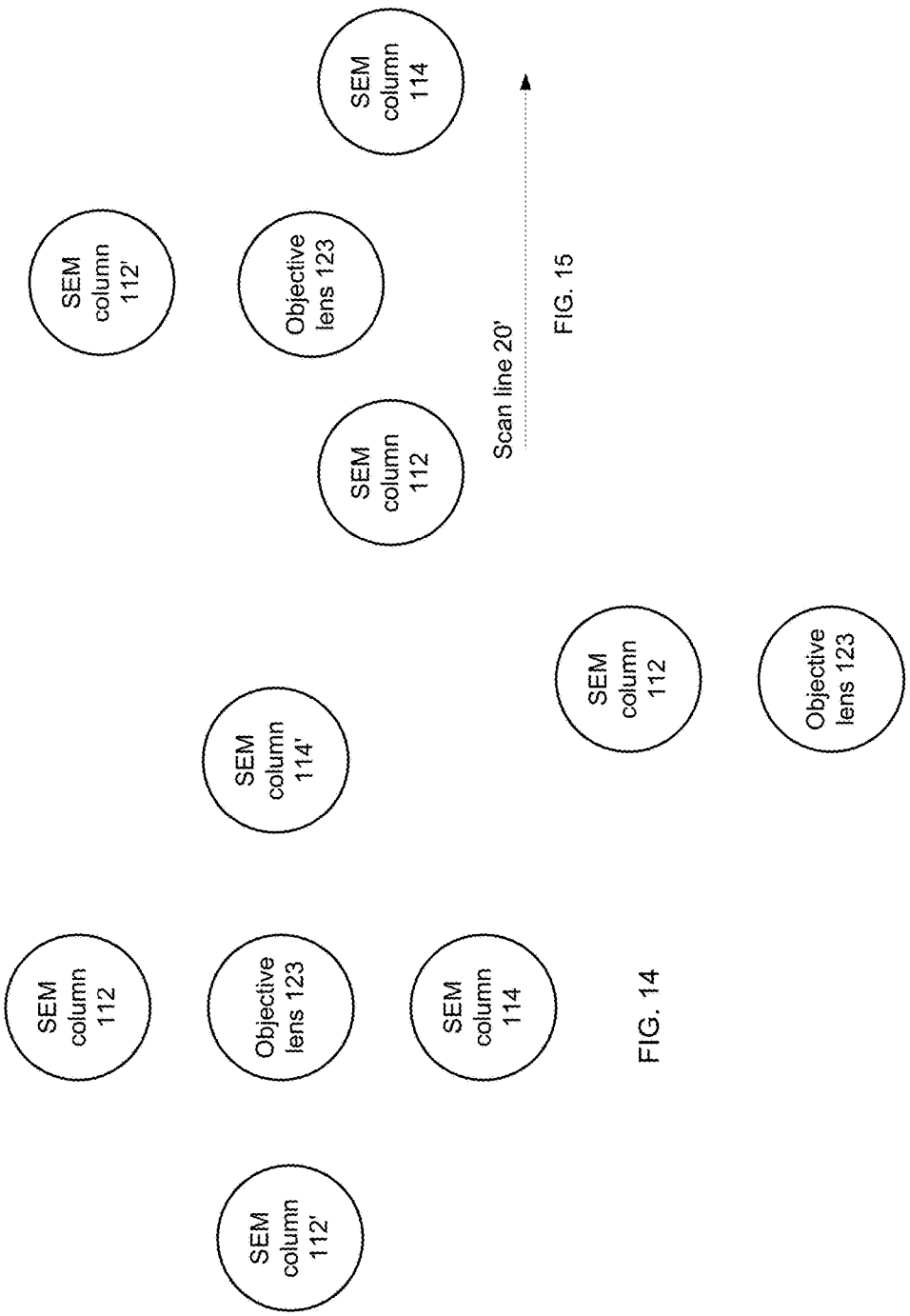

| |
|---|
| Scanning the sample by an optical beam, by optics of the inspection unit and during the scan period. 341 |
| Directing by the illumination module a light beam towards A beam splitter when operating in a bright field operational mode. 343 |
| Directing by the illumination module a light beam through a window and towards a dark field deflector when operating in a dark field operational mode. 344 |
| Receiving, by the objective lens, a light beam from a beam splitter and directing the light beam towards the sample. 345 |
| Directing, by the objective lens, light emitted from the sample through a beam splitter and towards a light sensor. 346 |
| Scanning, by the inspection unit, the sample in compliance with the scan pattern. 347 |
| Illuminating, by the inspection unit, the sample, during the scan period, with beams; wherein each of the beam propagates at least partially through a single vacuum zone maintained in the chamber, wherein the sample is located in the single vacuum zone. 348 |

| |
|---|
| Scanning the sample by a charged particle beam, by a column of the review unit and during the scan period. 361 |
| Scanning by the column a location of a certain suspected defect out of the multiple suspected defects by deflecting the charged particle beam and at least partially countering the scan pattern. 363 |
| Scanning the sample during the scan period by multiple charged particle beams generated by the review unit and the inspection unit. 364 |
| Scanning by each column of multiple columns of the review unit the sample during the scan period with a charged particle beam. 365 |
| Scanning, by the review unit, areas of the sample that may include at least a part of the multiple suspected defects while deviating from the scan pattern. 366 |
| Reviewing, by at least one scanning electron microscope (SEM) column of the review unit, the sample at locations of interest on a scanning line which was previously scanned by the inspection unit 367. |
| Illuminating, by the review unit, the sample, during the scan period, with beams; wherein each of the beam propagates at least partially through a single vacuum zone maintained in the chamber, wherein the sample is located in the single vacuum zone. 368 |
| Following the review scheme to detect the at least one actual defect. 369 |
| Scanning, by the review unit, an area of a suspected defect by deviating from one of the parallel scan lines of a scan pattern. 361' |
| Scanning, by the review unit, an area of a suspected defect by deflecting a charged particle beam along one of parallel scan lines of a scan pattern. 362' |
| Reviewing, by the review unit, the sample, during the scan period, the sample while the inspection unit inspects the sample. 363' |
| Reviewing by the review unit at least one suspected defect while the inspection unit searches for another suspected defect. 364' |
| Determining, by the review unit, a review scheme in response to the scan pattern and to information about the multiple suspected defects. 365' |
| Determining, by a controller, a review scheme in response to a scan pattern and to information about the multiple suspected defects. 366' |
| Selecting a subset of the multiple suspected defects to be reviewed by the review unit. 367' |
| Selecting of the subset in response to design data of the sample. 368' |

SYSTEM FOR INSPECTING AND REVIEWING A SAMPLE

BACKGROUND OF THE INVENTION

A semiconductor wafer (hereinafter wafer) is manufactured by a highly complex manufacturing process. The manufacturing process can be monitored by detecting defects by a dual phase process. A first phase of the process includes placing the wafer in an atmospheric environment and inspecting the wafer, by an inspection tool, to detect suspected defects. A second phase of the process includes placing the wafer in a vacuumed environment and reviewing the suspected defects by a scanning electron microscope (SEM) to detect actual defects.

The amount of suspected defects can be very large in which case suspected defects information may require substantial communication resources for being communicated between the inspection tool and the SEM. For example, the suspected defects information may require substantial memory resources for being stored in the inspection tool and in the SEM. Also, the transition of the wafer from the inspection tool in the first phase of the process to the SEM in the second phase may require the SEM to perform a time consuming and complex alignment process in order to locate the suspected defects.

There is a growing need to provide efficient systems and methods for inspecting and reviewing a wafer.

BRIEF SUMMARY OF THE INVENTION

According to an embodiment of the invention a system for inspecting and reviewing a sample is provided. The system may include a chamber that may be arranged to receive the sample and to maintain vacuum within the chamber during at least a scan period, an inspection unit, a review unit, and a mechanical stage for moving the sample, according to a scan pattern and during the scan period, in relation to the inspection unit and the review unit while a spatial relationship between the inspection unit and the review unit remains unchanged. The inspection unit may be arranged to detect, during the scan period, multiple suspected defects of the sample, and the review unit may be arranged to: (a) receive, during the scan period, information about the multiple suspected defects, and (b) locate, during the scan period and in response to the information about the multiple suspected defects, at least one actual defect.

The inspection unit may include optics that may be arranged to scan the sample during the scan period with a photon beam, and the review unit may include a column that may be arranged to scan the sample during the scan period with a charged particle beam.

The column may be arranged to scan a location of a certain suspected defect out of the multiple suspected defects by deflecting the charged particle beam and at least partially countering the scan pattern.

At least a portion of the column and at least a portion of the optics may be positioned within the chamber.

The inspection unit and the review unit may be arranged to scan the sample during the scan period with charged particle beams.

The review unit may include multiple columns, wherein each column of the multiple columns may be arranged to scan the sample during the scan period with a charged particle beam.

The inspection unit may include optics that may be arranged to scan the sample during the scan period with a photon beam; and wherein the multiple columns may be located at opposite sides of the optics.

The system may be arranged to output information relating to actual defects and to prevent an output of information relating to suspected defects.

The inspection unit may include an objective lens, an illumination module, a dark field deflector, a beam splitter and a light sensor. The chamber may include a window and an opening with the objective lens being positioned within the opening and the illumination module, the beam splitter and light sensor being positioned outside the chamber. The dark field deflector may be positioned within the chamber. The illumination module may be arranged to direct a light beam towards the beam splitter when operating in a bright field operational mode, and the illumination module may be arranged to direct a light beam through the window and towards the dark field deflector when operating in a dark field operational mode. The objective lens may be arranged to receive a light beam from the beam splitter and direct the light beam towards the sample, and the objective lens may be arranged to direct light emitted from the sample through the beam splitter and towards a light sensor.

A distance between an optical axis of the inspection unit and an optical axis of the review unit does not exceed a diameter of the sample.

A distance between an optical axis of the inspection unit and an optical axis of the review unit exceeds a diameter of the sample.

A distance between an optical axis of the inspection unit and an optical axis of the review unit does not exceed centimeters.

The inspection unit may be arranged to scan the sample in compliance with the scan pattern and wherein the review unit may be arranged to scan areas of the sample that may include at least a part of the multiple suspected defects while deviating from the scan pattern.

The review unit may include at least one scanning electron microscope (SEM) column that may be positioned with respect to the inspection unit such that the at least one SEM column may be operable to review the sample at locations of interest on a scanning line which was previously scanned by the inspection unit.

The inspection unit and the review unit may be arranged to illuminate the sample, during the scan period, with beams; and wherein each of the beams propagates at least partially through a single vacuum zone maintained in the chamber; wherein the sample may be located in the single vacuum zone.

The review unit may be arranged to determine a review scheme in response to the scan pattern and to information about the multiple suspected defects and follow the review scheme to detect the at least one actual defect.

The system may include a controller that may be arranged to determine a review scheme in response to the scan pattern and to information about the multiple suspected defects; and wherein the review unit may be arranged to follow the review scheme to detect the at least one actual defect.

The scan pattern may include a plurality of parallel scan lines, wherein the review unit may be arranged to scan an area of a suspected defect by deviating from one of the parallel scan lines.

The scan pattern may include a plurality of parallel scan lines, wherein the review unit may be arranged to scan an area of a suspected defect by deflecting a charged particle beam along one of the parallel scan lines.

The system may be arranged to select a subset of the multiple suspected defects to be reviewed by the review unit.

The selection of the subset may be responsive to design data of the sample.

The review unit and the inspection unit may be positioned so that the review unit may be operable to review the sample while the inspection unit inspects the sample.

The review unit may be arranged to review at least one suspected defect while the inspection unit searches for another suspected defect.

According to an embodiment of the invention there may be provided a system for inspecting and reviewing a sample. The system may include a chamber that may be arranged to receive the sample and to maintain vacuum within the chamber, an inspection unit, a review unit, and a mechanical stage for moving the sample in relation to the inspection unit and the review unit thereby causing various locations of the sample to be accessible to the inspection unit before being accessible to the review unit. The inspection unit may be arranged to detect at certain locations out of the various locations, and before the certain locations may be accessible to the review unit, suspected defects of the sample. The review unit may be arranged to review the certain locations and determine whether the suspected defects represent actual defects.

A spatial relationship between the inspection unit and the review unit remains unchanged during the scan period.

The review unit may include multiple columns, wherein each column of the multiple columns may be arranged to scan the sample with a charged particle beam.

The multiple columns may be located at opposite sides of optics of the inspection unit.

The system may be arranged to output information relating to actual defects and to prevent an output of information relating to suspected defects.

The inspection unit may include an objective lens, an illumination module, a dark field deflector, a beam splitter and a light sensor; wherein the chamber may include a window and an opening; wherein the objective lens may be positioned within the opening; wherein the illumination module, the beam splitter and light sensor may be positioned outside the chamber; wherein the dark field deflector may be positioned within the chamber; wherein the illumination module may be arranged to direct a light beam towards the beam splitter when operating in a bright field operational mode; wherein the illumination module may be arranged to direct a light beam through the window and towards the dark field deflector when operating in a dark field operational mode; wherein the objective lens may be arranged to receive a light beam from the beam splitter and direct the light beam towards the sample; and wherein the objective lens may be arranged to direct light emitted from the sample through the beam splitter, and towards a light sensor.

According to an embodiment of the invention there may be provided a system for inspecting and reviewing a sample. The system may include a chamber that may be arranged to receive the sample and to maintain a vacuum zone within the chamber, an inspection unit, a review unit, and a mechanical stage for moving the sample, according to a scan pattern, in relation to the inspection unit and the review unit. The inspection unit may be arranged to illuminate the sample by a first beam that propagates through the vacuum zone, and to detect multiple suspected defects of the sample. The review unit may be arranged to receive information about the multiple suspected defects, illuminate the sample by a second beam that propagates through the vacuum zone, and locate, in response to the information about the multiple suspected defects, at least one actual defect.

At least a portion of a column of the review unit and at least a portion of optics of the inspection unit may be positioned within the vacuum zone.

According to an embodiment of the invention there may be provided a system for inspecting and reviewing samples. The system may include a chamber that may be arranged to receive the samples and to maintain vacuum within the chamber, an inspection unit, a review unit and a mechanical stage for moving samples according to a scan pattern and during a scan period, in relation to the inspection unit and the review unit. A fixed relationship may be maintained between a coordinate system of the inspection unit and a coordinate system of the review unit, and the inspection unit may be arranged to detect, during the scan period, multiple suspected defects of a first sample of the samples. The review unit may also be arranged to receive, during the scan period, information about the multiple suspected defects, and locate, during the scan period and in response to the information about the multiple suspected defects, at least one actual defect.

According to an embodiment of the invention there may be provided a system for inspecting and reviewing a sample. The system may include a chamber that may be arranged to receive the sample and to maintain vacuum within the chamber, an inspection unit, a review unit, and a mechanical stage for moving the sample, according to a scan pattern, in relation to the inspection unit and the review unit while a spatial relationship between the inspection unit and the review unit remains unchanged. The inspection unit may be arranged to detect, multiple suspected defects of the sample. The review unit may be arranged to receive information about the multiple suspected defects and locate in response to the information about the multiple suspected defects, at least one actual defect. The review unit may be further arranged to review at least one suspected defect of the multiple defects while the inspection unit searches for another suspected defect.

According to an embodiment of the invention there may be provided a method for inspecting and reviewing a sample, the method may include: receiving, by a chamber, the sample; maintaining vacuum within the chamber during at least a scan period; moving, by a mechanical stage, the sample, according to a scan pattern and during the scan period, in relation to an inspection unit and a review unit while a spatial relationship between the inspection unit and the review unit remains unchanged; detecting, by the inspection unit and during the scan period, multiple suspected defects of the sample; receiving, by the review unit and during the scan period, information about the multiple suspected defects; and locating at least one actual defect, by the review unit, during the scan period, and in response to the information about the multiple suspected defects.

The method may include (a) scanning the sample by an optical beam, by optics of the inspection unit and during the scan period; and (b) scanning the sample by a charged particle beam, by a column of the review unit and during the scan period.

The method may include scanning by the column a location of a certain suspected defect out of the multiple suspected defects by deflecting the charged particle beam and at least partially countering the scan pattern.

At least a portion of the column and at least a portion of the optics may be positioned within the chamber.

The method may include scanning the sample during the scan period by multiple changed particle beams generated by the review unit and the inspection unit.

The review unit may include multiple columns, wherein the method may include scanning by each column of the multiple columns the sample during the scan period with a charged particle beam.

The multiple columns may be located at opposite sides of optics of the inspection unit.

The method may include outputting information relating to actual defects and preventing an output of information relating to suspected defects.

The inspection unit may include an objective lens, an illumination module, a dark field deflector, a beam splitter and a light sensor; wherein the chamber may include a window and an opening; wherein the objective lens may be positioned within the opening; wherein the illumination module, the beam splitter and light sensor may be positioned outside the chamber; wherein the dark field deflector may be positioned within the chamber; wherein the method may include: directing by the illumination module a light beam towards the beam splitter when operating in a bright field operational mode; directing by the illumination module a light beam through the window and towards the dark field deflector when operating in a dark field operational mode; receiving, by the objective lens, a light beam from the beam splitter and directing the light beam towards the sample; and directing, by the objective lens, light emitted from the sample through the beam splitter and towards a light sensor.

A distance between an optical axis of the inspection unit and an optical axis of the review unit does not exceed a diameter of the sample.

A distance between an optical axis of the inspection unit and an optical axis of the review unit exceeds a diameter of the sample.

A distance between an optical axis of the inspection unit and an optical axis of the review unit does not exceed 35 centimeters.

The method may include scanning, by the inspection unit, the sample in compliance with the scan pattern; and scanning, by the review unit, areas of the sample that may include at least a part of the multiple suspected defects while deviating from the scan pattern.

The review unit may include at least one scanning electron microscope (SEM) column that may be positioned with respect to the inspection unit such that the at least one SEM column may be operable to review the sample at locations of interest on a scanning line which was previously scanned by the inspection unit.

The method may include illuminating, by the inspection unit and the review unit, the sample, during the scan period, with beams; wherein each of the beams propagates at least partially through a single vacuum zone maintained in the chamber; and wherein the sample may be located in the single vacuum zone.

The method may include: determining, by the review unit, a review scheme in response to the scan pattern and to information about the multiple suspected defects; and following the review scheme to detect the at least one actual defect.

The method may include determining, by a controller, a review scheme in response to the scan pattern and to information about the multiple suspected defects; and wherein the review unit may be arranged to follow the review scheme to detect the at least one actual defect.

The scan pattern may include a plurality of parallel scan lines, wherein the method may include scanning, by the review unit, an area of a suspected defect by deviating from one of the parallel scan lines.

The scan pattern may include a plurality of parallel scan lines, wherein the method may include scanning, by the review unit, an area of a suspected defect by deflecting a charged particle beam along one of the parallel scan lines.

The method may include selecting a subset of the multiple suspected defects to be reviewed by the review unit.

The selecting of the subset may be responsive to design data of the sample.

The review unit and the inspection unit may be positioned so that the review unit may be operable to review the sample while the inspection unit inspects the sample.

The method may include reviewing by the review unit at least one suspected defect while the inspection unit searches for another suspected defect.

According to an embodiment of the invention there may be provided a method for inspecting and reviewing a sample. The method may include receiving, by a chamber, the sample; maintaining vacuum within the chamber; moving, by a mechanical stage, the sample in relation to an inspection unit and a review unit thereby causing various locations of the sample to be accessible to the inspection unit before being accessible to the review unit; detecting, by the inspection unit, suspected defects at certain locations out of the various locations, and before the certain locations may be accessible to the review unit; and reviewing by the review unit the certain locations and determining whether the suspected defects represent actual defects.

A spatial relationship between the inspection unit and the review unit remains unchanged during a scan period.

The review unit may include multiple columns, wherein the method may include scanning by each column of the multiple columns, the sample with a charged particle beam.

The multiple columns may be located at opposite sides of optics of the inspection unit.

The method may include outputting information relating to actual defects and to preventing an output of information relating to suspected defects.

The inspection unit may include an objective lens, an illumination module, a dark field deflector, a beam splitter and a light sensor. The chamber may include a window and an opening and the objective lens may be positioned within the opening. The illumination module, the beam splitter and light sensor may be positioned outside the chamber while the dark field deflector may be positioned within the chamber. The method may include directing by the illumination module a light beam towards the beam splitter when operating in a bright field operational mode, directing by the illumination module a light beam through the window and towards the dark field deflector when operating in a dark field operational mode, receiving by the objective lens a light beam from the beam splitter and directing the light beam towards the sample, and directing, by the objective lens, light emitted from the sample through the beam splitter and towards a light sensor.

According to an embodiment of the invention a method for inspecting and reviewing a sample is provided. The method may include receiving the sample by a chamber; maintaining, by the chamber, a vacuum zone within the chamber; moving by a mechanical stage the sample, according to a scan pattern, in relation to an inspection unit and a review unit; illuminating, by the inspection unit, the sample by a first beam that propagates through the vacuum zone; detecting, by the inspection unit, multiple suspected defects of the sample; receiving, by the review unit, information about the multiple suspected defects; illuminating, by the review unit, the sample by a second beam that propagates through the vacuum zone; and locating, by the review unit and in response to the information about the multiple suspected defects, at least one actual defect.

At least a portion of a column of the review unit and at least a portion of optics of the inspection unit may be positioned within the vacuum zone.

According to another embodiment of the invention a method for inspecting and reviewing samples is provided where the method may include receiving, by a chamber, the sample; maintain vacuum within the chamber; moving, by a mechanical stage, the sample, according to a scan pattern, in relation to an inspection unit and a review unit; wherein a fixed relationship may be maintained between a coordinate method of the inspection unit and a coordinate method of the review unit; detecting, by the inspection unit and during a scan period, multiple suspected defects of the sample; receiving, by the review unit and during the scan period, information about the multiple suspected defects; and locating at least one actual defect, by the review unit, during the scan period, and in response to the information about the multiple suspected defects.

According to still an embodiment of the invention a method for inspecting and reviewing a sample is provided where the method may include: receiving, by a chamber, the sample; maintain vacuum within the chamber; moving, by a mechanical stage, the sample, according to a scan pattern, in relation to an inspection unit and a review unit; detecting, by the inspection unit and during a scan period, multiple suspected defects of the sample; receiving, by the review unit and during the scan period, information about the multiple suspected defects; and locating at least one actual defect, by the review unit, during the scan period, and in response to the information about the multiple suspected defects; wherein the locating may include reviewing at least one suspected defect of the multiple defects while the inspection unit searches for another suspected defect.

BRIEF DESCRIPTION OF THE DRAWINGS

Further details, aspects and embodiments of the invention will be described, by way of example only, with reference to the drawings. In the drawings, the same reference numbers are used to identify like or functionally similar elements. Elements in the figures are illustrated for simplicity and clarity and have not necessarily been drawn to scale.

FIG. 10 illustrates an arrangement of one or more SEM columns of a review unit and of an objective lens of an inspection unit according to an embodiment of the invention;

FIG. 11 illustrates an arrangement of one or more SEM columns of a review unit and of an objective lens of an inspection unit according to an embodiment of the invention;

FIG. 12 illustrates an arrangement of one or more SEM columns of a review unit and of an objective lens of an inspection unit according to an embodiment of the invention;

FIG. 13 illustrates an arrangement of one or more SEM columns of a review unit and of an objective lens of an inspection unit according to an embodiment of the invention;

FIG. 14 illustrates an arrangement of one or more SEM columns of a review unit and of an objective lens of an inspection unit according to an embodiment of the invention;

FIG. 15 illustrates an arrangement of one or more SEM columns of a review unit and of an objective lens of an inspection unit according to an embodiment of the invention;

FIG. 16 illustrates an arrangement of one or more SEM columns of a review unit and of an objective lens of an inspection unit according to an embodiment of the invention;

FIG. 19 illustrates various steps included in a step of the method of FIG. 18 according to an embodiment of the invention;

FIG. 20 illustrates various steps included in a step of the method of FIG. 18 according to an embodiment of the invention;

DETAILED DESCRIPTION OF THE INVENTION

Figure 1:
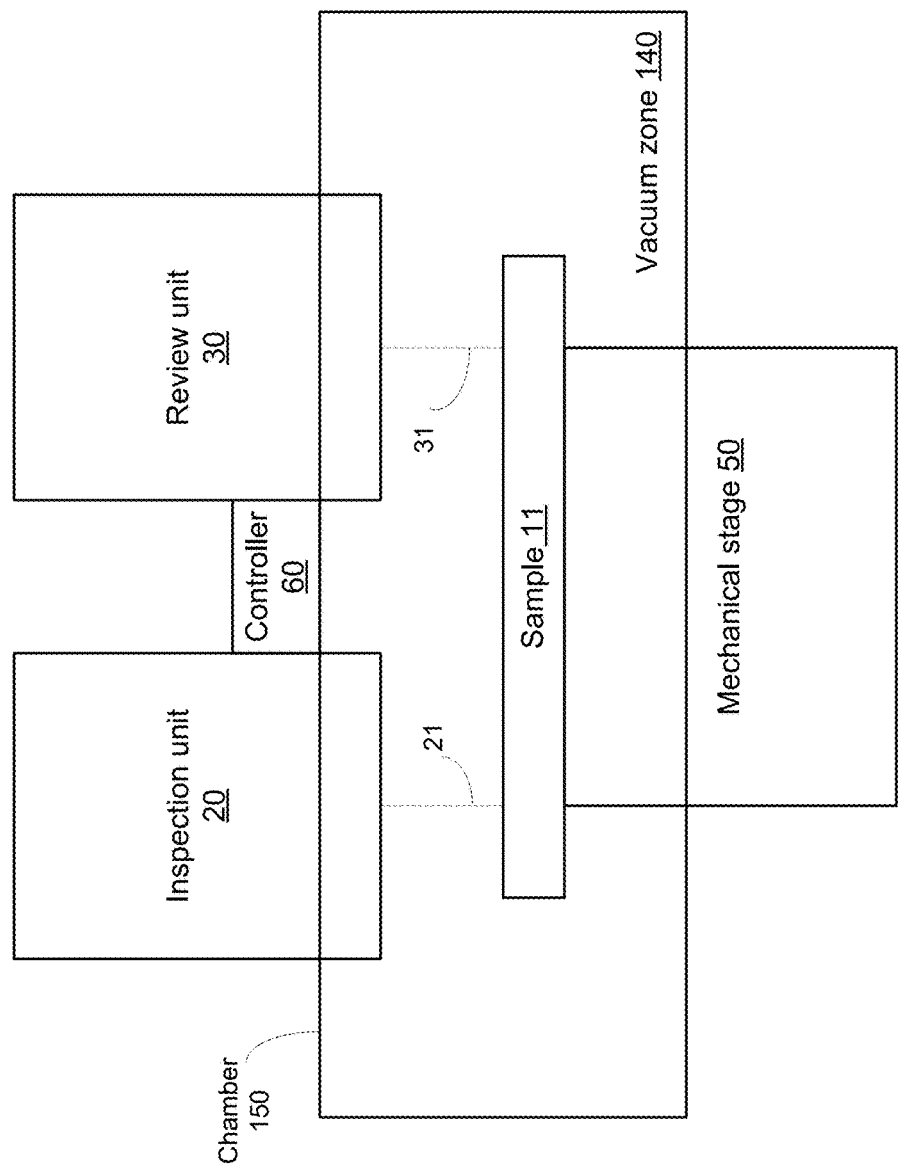
FIG. 1 illustrates a system according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may, for the most part, be implemented using electronic components and modules known to those skilled in the art, details will not be explained in any greater extent than that considered necessary as illustrated above, for the understanding and appreciation of the underlying concepts of the present invention and in order not to obfuscate or distract from the teachings of the present invention.

The assignment of the same reference numbers to various components may indicate that these components are similar to each other.

The foregoing and other objects, features, and advantages of the present invention will become more apparent from the following detailed description when taken in conjunction with the accompanying drawings. In the drawings, similar reference characters denote similar elements throughout the different views.

Because the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

FIG. 1 is a cross sectional view of a sample 11 and a system 100 according to an embodiment of the invention.

System 100 is for inspecting and reviewing sample 11. The system 100 includes:

a. Chamber 150 that is arranged to receive the sample 11 and to maintain vacuum (illustrated by vacuum zone 140) within the chamber during at least a scan period.
b. Inspection unit 20.
c. Review unit 30.
d. A mechanical stage 50 for moving the sample 11, according to a scan pattern and during the scan period, in relation to the inspection unit 20 and the review unit 30 while a spatial relationship between the inspection unit 20 and the review unit 30 remains unchanged. The scan period is the period during which the mechanical stage 50 moves the sample 11 in relation to the inspection unit 20 and the review unit 30.
e. Controller 60 for controlling the operation of system 100.
f. An interface (not shown) for communicating with entities outside system 100.

The spatial relationship can be maintained unchanged by connecting, directly or indirectly, the inspection unit 20 to the review unit 30 and isolating the movement of the mechanical stage 50 from the inspection unit 20 and the review unit 30.

The inspection unit 20 and the review unit 30 can be maintained in a fixed position during the scan period.

Additionally or alternatively, the system 100 may include dumping elements and/or other means for allowing the inspection unit 20 and the review unit 30 to maintain static despite the movement of the mechanical stage 50.

The inspection unit 20 may be arranged to detect, during the scan period, multiple suspected defects of the sample.

The inspection unit 20 may apply any known inspection algorithms for detecting suspected defects. Non-limiting examples of inspection algorithms include cell to cell comparison, die to die comparison, reference data based comparison, design data based comparison and the like.

The inspection unit 20 may scan the sample 11 by one or more beams—such as first beam 21. The first beam 21 (or any other beam generated by the inspection unit 20) may be a photon beam, a charged particle beam or any type of electromagnetic beam. For simplicity of explanation it is assumed that first beam 21 propagates along an optical axis of the inspection unit 20.

A part of inspection unit 20 is illustrated as entering the chamber 150. This part may include, for example, optical components such as but not limited to lenses, beam splitters, deflectors, reflectors and the like.

It is noted that the inspection unit 20 may be located completely within the chamber 150 or almost entirely outside the chamber 150.

The review unit 30 may be arranged to (a) receive, during the scan period, information about the multiple suspected defects; and (b) locate, during the scan period and in response to the information about the multiple suspected defects, at least one actual defect.

The review unit 30 may apply any known inspection algorithms for reviewing suspected defects.

The review unit 30 may scan the sample 11 by one or more beams—such as second beam 31. The second beam 31 (or any other beam generated by the review unit 30) may be a photon beam, a charged particle beam or any type of electromagnetic beam. For simplicity of explanation it is assumed that second beam 31 propagates along an optical axis of the review unit 30.

A part of review unit 30 is illustrated as entering the chamber 150. This part may include, for example, optical components such as but not limited to lenses, beam splitters, deflectors, reflectors and the like. It is noted that the review unit 30 may be located completely within the chamber 150 or almost entirely outside the chamber 150.

The mechanical stage 50 is illustrated as having a first part within the chamber and another part located outside the chamber 150. This configuration may reduce the contamination of the chamber 150 by the mechanical stage 50. It is noted that the mechanical stage 50 may be located completely within the chamber 150 or almost entirely outside the chamber 150.

Controller 60 may, for example coordinate between the movement of the mechanical stage 50, the inspection of the inspection unit 20 and the review of the review unit 30.

It is noted that at least a portion of the functionality of the controller 60 may be provided by computational resources of the inspection unit 20 and/or the review unit 30.

Figure 2:
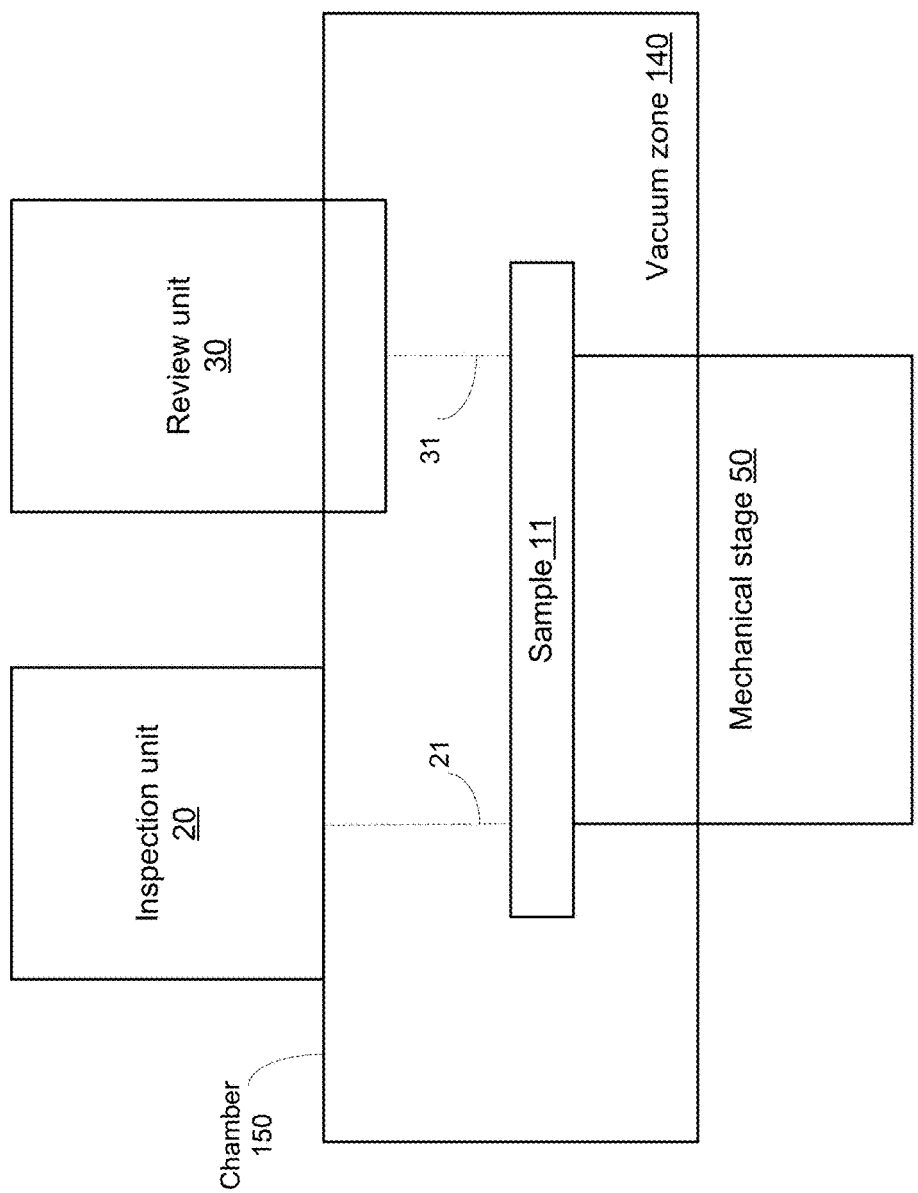
FIG. 2 illustrates a system according to an embodiment of the invention.

FIG. 2 is a cross sectional view of a sample 11 and a system 100' according to an embodiment of the invention.

System 100' of FIG. 2 differs from system 100 of FIG. 1 by having the inspection unit 20 entirely outside the chamber 150. For simplicity of explanation—controller 60 and an interface were not shown in FIG. 2.

In both systems 100 and 100' of FIGS. 1 and 2 the distance between an optical axis of the inspection unit and an optical axis of the review unit may not exceed a diameter of the sample, may exceed the diameter of the sample, may not exceed 30 centimeters, may not exceed 40 centimeters or have fulfill any other limitation.

The inspection unit 20 of either one of systems 100 and 100' may be arranged to scan the sample in compliance with the scan pattern (introduced by the mechanical stage) and the review unit may be arranged to scan areas of the sample that include at least a part of the multiple suspected defects while deviating from the scan pattern. The deviation may include deflection that counter the mechanical movement introduced by the mechanical stage or may be any other deviation.

For example—the scan pattern may include a plurality of parallel scan lines (for example it may form a raster scan pattern). The review unit 30 may be arranged to scan an area of a suspected defect by deviating from one of the parallel scan lines. Alternatively—the review unit may be arranged to scan an area of a suspected defect by deflecting a charged particle beam along one of the parallel scan lines.

Either one of systems 100 or 100' may be arranged to output information (via an interface not illustrated in FIG. 1) relating to actual defects and to prevent an output of information relating to suspected defects. This may dramatically reduce the communication and storage resources allocated to information outputted from systems 100 and 100'.

In either one of systems 100 or 100' the review unit 30 may follows a review scheme when reviewing suspected defects. The review scheme may include a selection of a subset of suspected defects to review and/or an order of reviewing the subset of suspected defects.

The selection of the subset may be responsive to design data of the sample.

The review scheme can be determined by the review unit 30, by controller 60 or by cooperation between the review unit 30 and the controller 60.

Accordingly, the review unit 30 may be arranged to determine a review scheme in response to the scan pattern and to information about the multiple suspected defects; and follow the review scheme to detect the at least one actual defect.

Alternatively, the controller 60 may be arranged to determine the review scheme in response to the scan pattern and to information about the multiple suspected defects; wherein the review unit is arranged to follow the review scheme to detect the at least one actual defect.

In either one of systems 100 and 100' the review unit 30 and the inspection unit 20 may be positioned so that the review unit 30 is operable to review the sample while the inspection unit 20 inspects the sample.

In either one of systems 100 or 100' the review unit 30 may be arranged to review at least one suspected defect while the inspection unit 20 searches for another suspected defect.

In either one of systems 100 and 100' the review unit 30 and the inspection unit 20 may share a same coordinate system or at least have a fixed relationship between their coordinate systems during the scan period.

Figure 3:
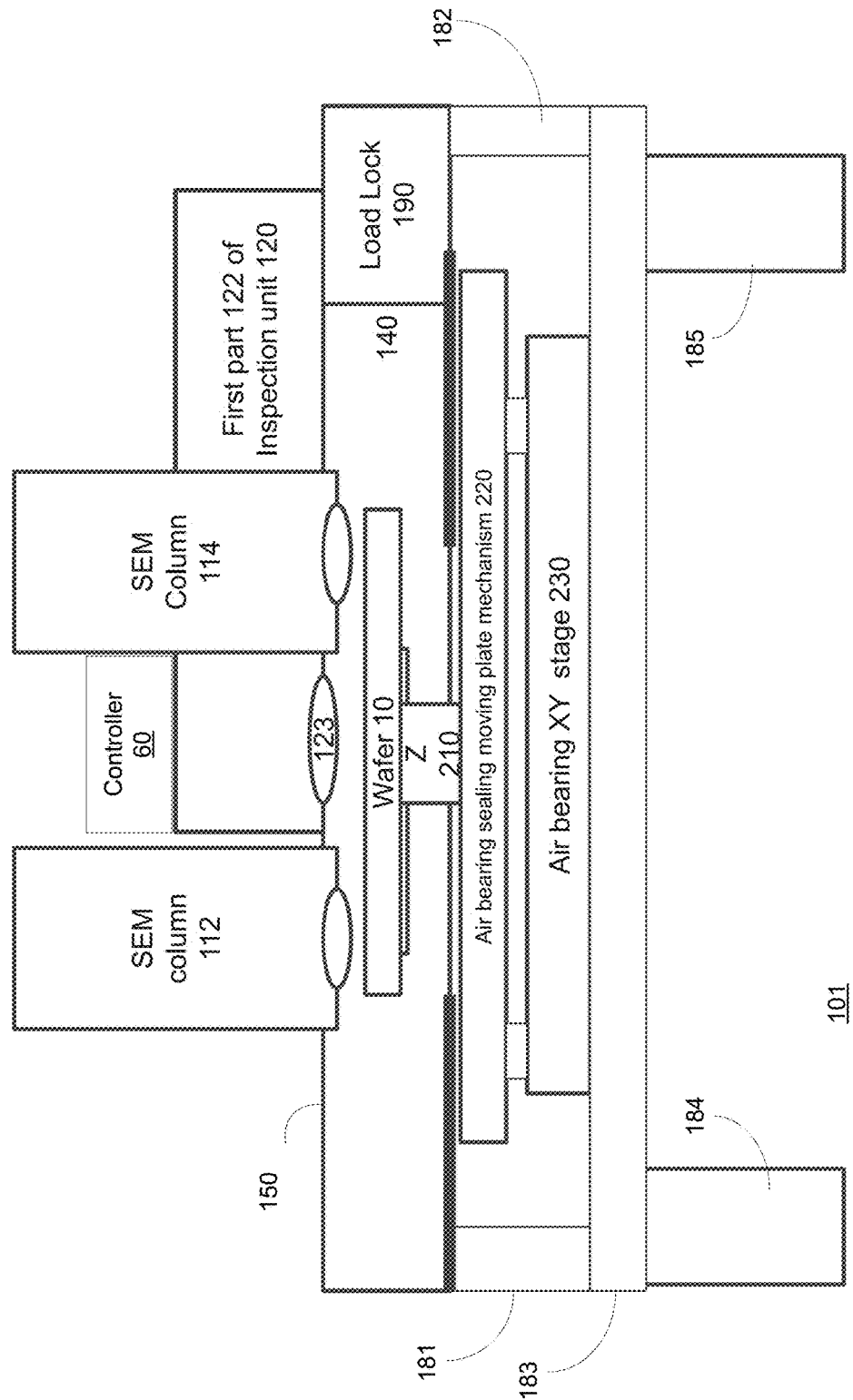
FIG. 3 illustrates a system according to an embodiment of the invention.
Figure 4:
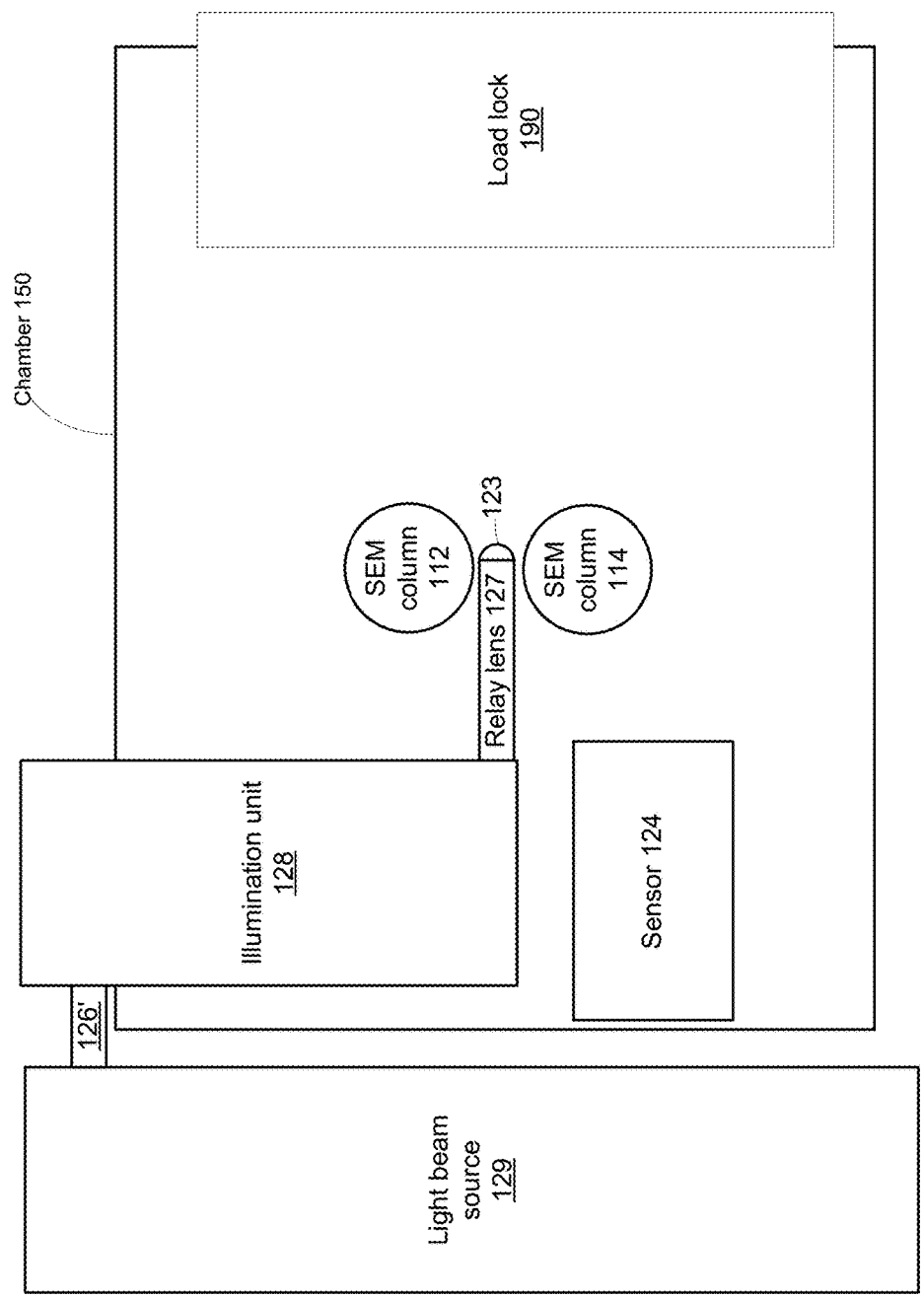
FIG. 4 illustrates a system according to an embodiment of the invention.
Figure 5:
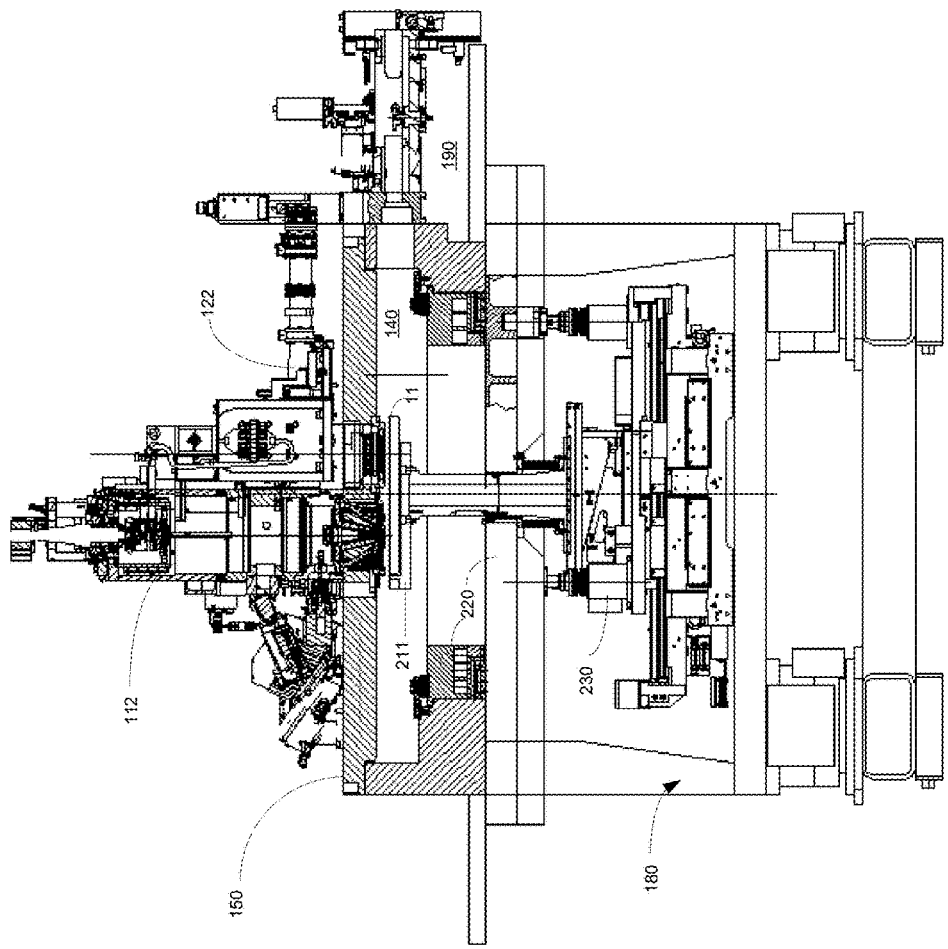
FIG. 5 illustrates a system according to an embodiment of the invention.
Figure 6:
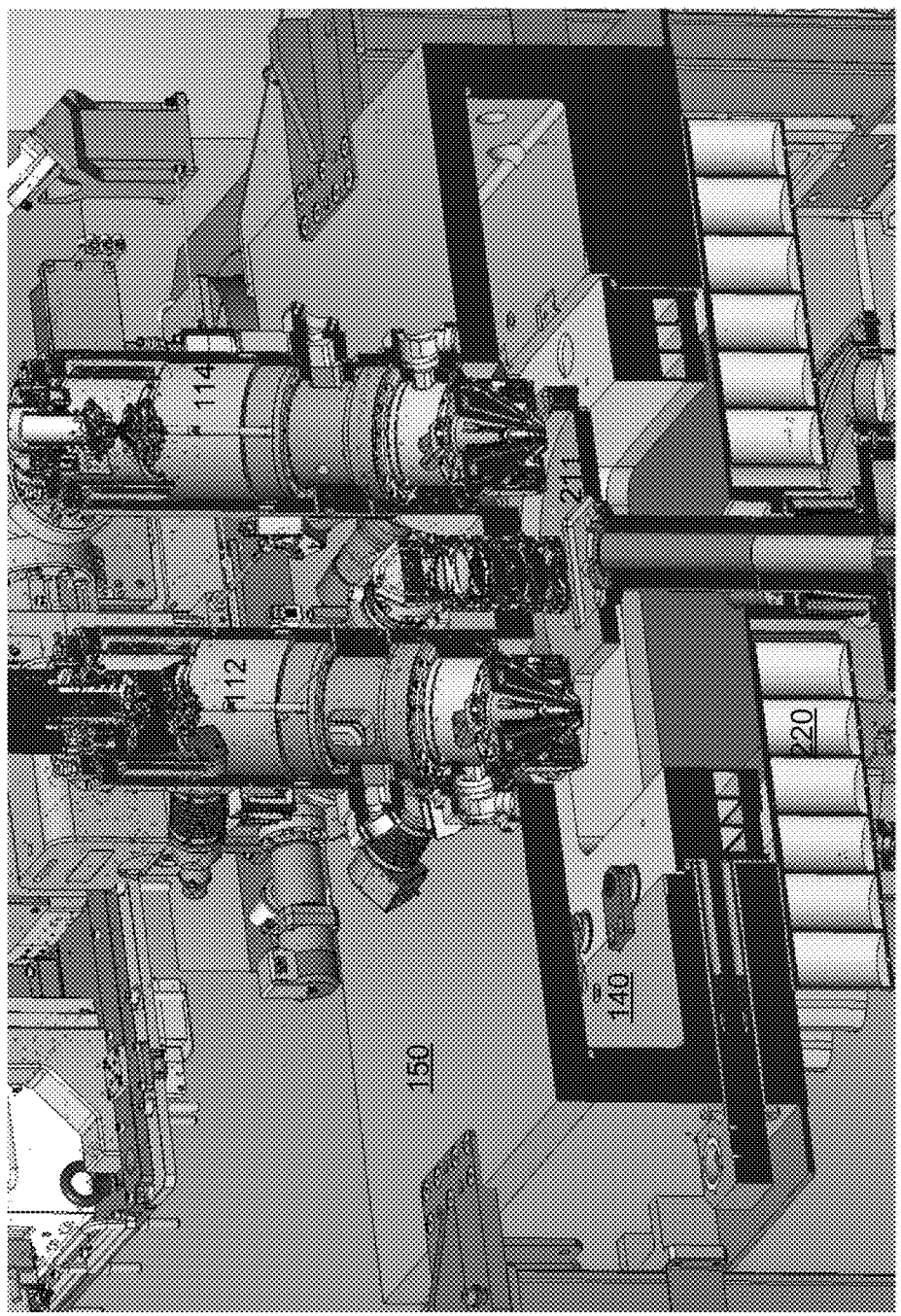
FIG. 6 illustrates a portion of a system according to an embodiment of the invention.

FIG. 3 illustrates a sample that is a wafer 10 and a system 101 according to an embodiment of the invention. FIG. 4 is a top view of system 101 according to an embodiment of the invention. FIG. 5 is a cross sectional view of a sample 11 and a system 101 according to an embodiment of the invention. FIG. 6 is a cross sectional view of a portion of system 101 according to an embodiment of the invention.

Referring to FIGS. 3, 5 and 6—system 101 includes:
  a. First SEM column (denoted SEM column 112).
  b. Second SEM column (denoted SEM column 114).
  c. Controller 60.
  d. Chamber 150.
  e. Z-axis mechanical stage 210.
  f. Air bearing sealing moving plate mechanism 220.
  g. Air bearing XY stage 230.
  h. Load lock 190.
  i. Inspection unit processor 126.
  j. First part 122 of inspection unit 120.
  k. Objective lens 123,
  l. Structural elements 181-185 for supporting other elements of the system 100'.

First SEM column 112 and second SEM processor 114 are parts of a dual column SEM that is a review unit.

First and second SEM columns 112 and 114 partially enter the vacuum zone 140 that is formed in chamber 150.

Each one of first and second SEM columns 112 and 114 may include charged particle beam generators, charged particle beam optics and one or more charged particle sensors.

Controller 60 may be arranged to control the operation of system 100. It may, additionally or alternatively, be arranged to control a generation of SEM images of suspected defects and detect actual defects based upon an analysis of the SEM images.

Objective lens 123, inspection unit processor 126 and first part 122 of inspection unit 120 form an inspection unit.

Objective lens 123 partially enters the vacuum zone 140 that is formed in chamber 150.

The first part 122 of inspection unit 120 may include an illumination source and optics.

The controller 60 may also be arranged to generate optical images of various areas of the wafer 10 and detect suspected defects based upon an analysis of the optical images.

Load lock 190 may be used to insert wafer 10 into chamber 150 and to remove wafer 10 from chamber 150.

Z-axis mechanical stage 210, and air bearing XY stage 230 form a mechanical stage for moving wafer 10 according to a scan pattern.

Air bearing sealing moving plate mechanism 220 is arranged to seal chamber 150 while allowing a movement of the wafer 10 by the air bearing XY stage 230.

Referring to FIG. 4—the first part 122 of the inspection unit is illustrated as including a light beam source 129, light guide 126', an illumination module 128, relay lens 127 and light sensor 124.

The light guide 126' provides light from light beam source 129 to illumination module 128.

The relay lens 127 relays light between objective lens 123 and either one of the illumination module 128 and light sensor 124.

The objective lens 123 is positioned between first and second SEM columns 112 and 114. The chamber 150 is also connected to load lock 190.

Figure 7:
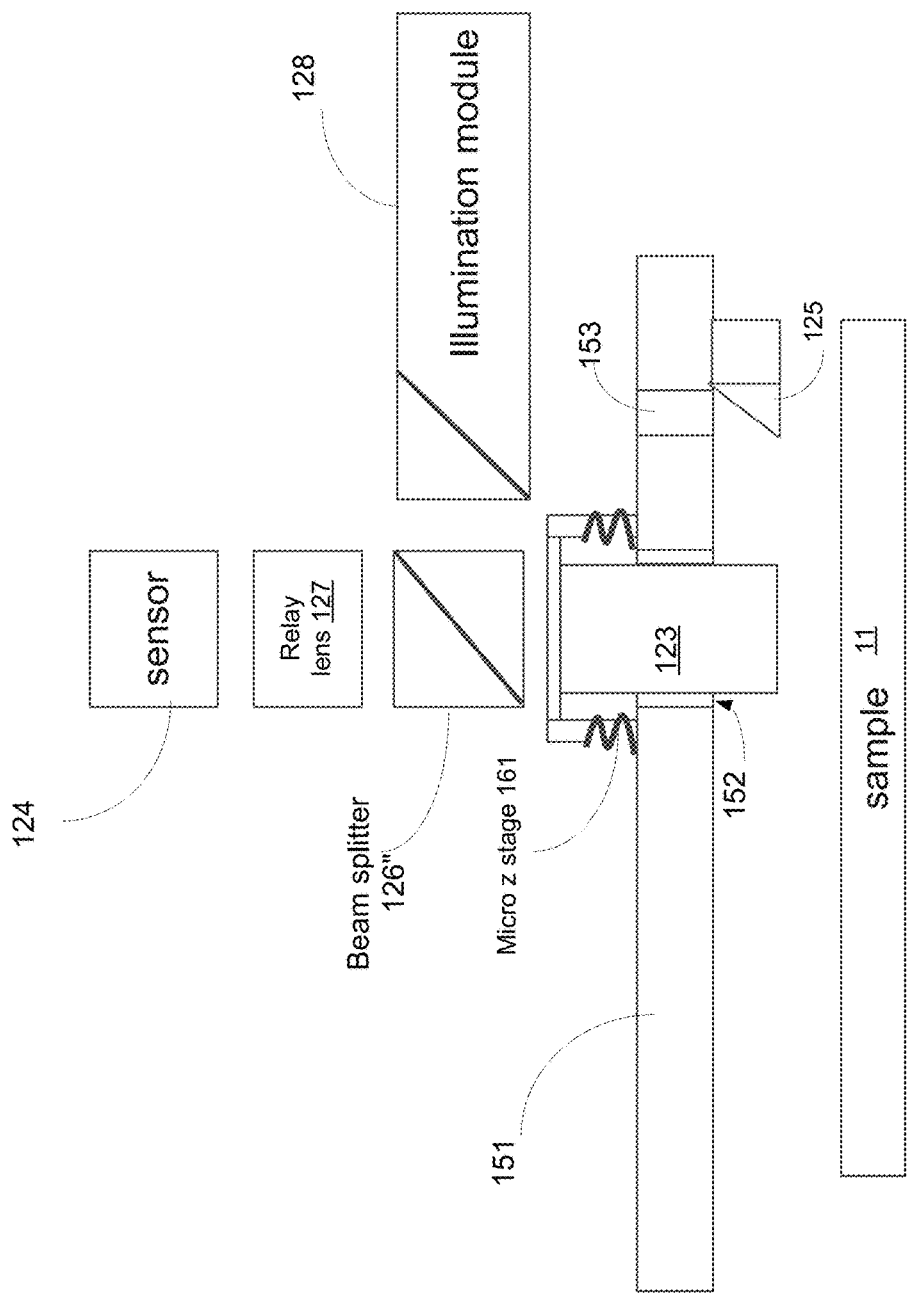
FIG. 7 illustrates a portion of a system according to an embodiment of the invention.

FIG. 7 illustrates a ceiling 151 of chamber 150 and the optics of the inspection unit 120.

The optics includes objective lens 123, illumination module 128, dark field deflector 125, beam splitter 126" and light sensor 124.

The ceiling 151 of the chamber 150 includes window 153 and opening 152. The objective lens 123 is positioned within the opening 152.

Any gap between the objective lens 123 and the edges of the opening 152 are sealed.

The illumination module 128, the beam splitter 126" and light sensor 124 are positioned outside the chamber 150. The dark field deflector 125 is positioned within the chamber 150.

The illumination module 128 is arranged to direct a light beam towards the beam splitter 126" when operating in a bright field operational mode.

The illumination module 128 is arranged to direct a light beam through the window and towards the dark field deflector 125 when operating in a dark field operational mode.

The objective lens 123 is arranged to receive a light beam from the beam splitter 126" and direct the light beam towards the sample 11.

The objective lens 123 is arranged to direct light emitted from the sample 11 through the beam splitter 126" and towards the light sensor 124.

Figure 8:
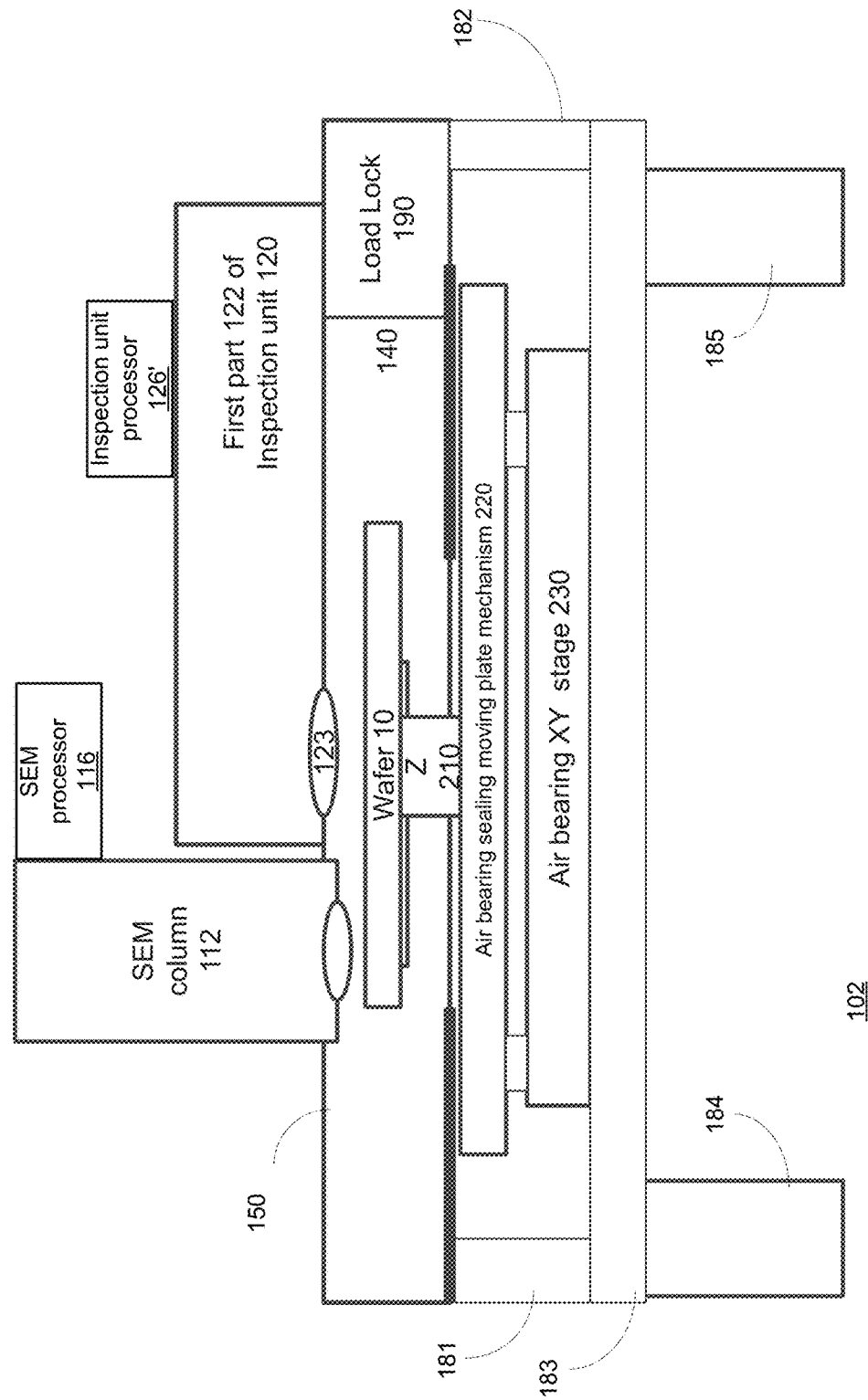
FIG. 8 illustrates a system according to an embodiment of the invention.

FIG. 8 illustrates a sample that is a wafer 10 and a system 102 according to an embodiment of the invention.

System 102 of FIG. 8 differs from system 101 of FIG. 3 by:
- s. Including a single SEM column 112—instead of having two SEM columns 112 and 114.
- t. Having, instead of controller 60, SEM processor 116' and an inspection unit processor 126.

SEM column 112 and SEM processor 116' are parts of a SEM that is a review unit.

SEM processor 116' may be arranged to generate SEM images of suspected defects and detect actual defects based upon an analysis of the SEM images.

Objective lens 123, inspection unit processor 126 and first part 122 of inspection unit 120 form an inspection unit.

The inspection unit processor 126 may be arranged to generate optical images of various areas of the wafer 10 and detect suspected defects based upon an analysis of the optical images.

Figure 9:
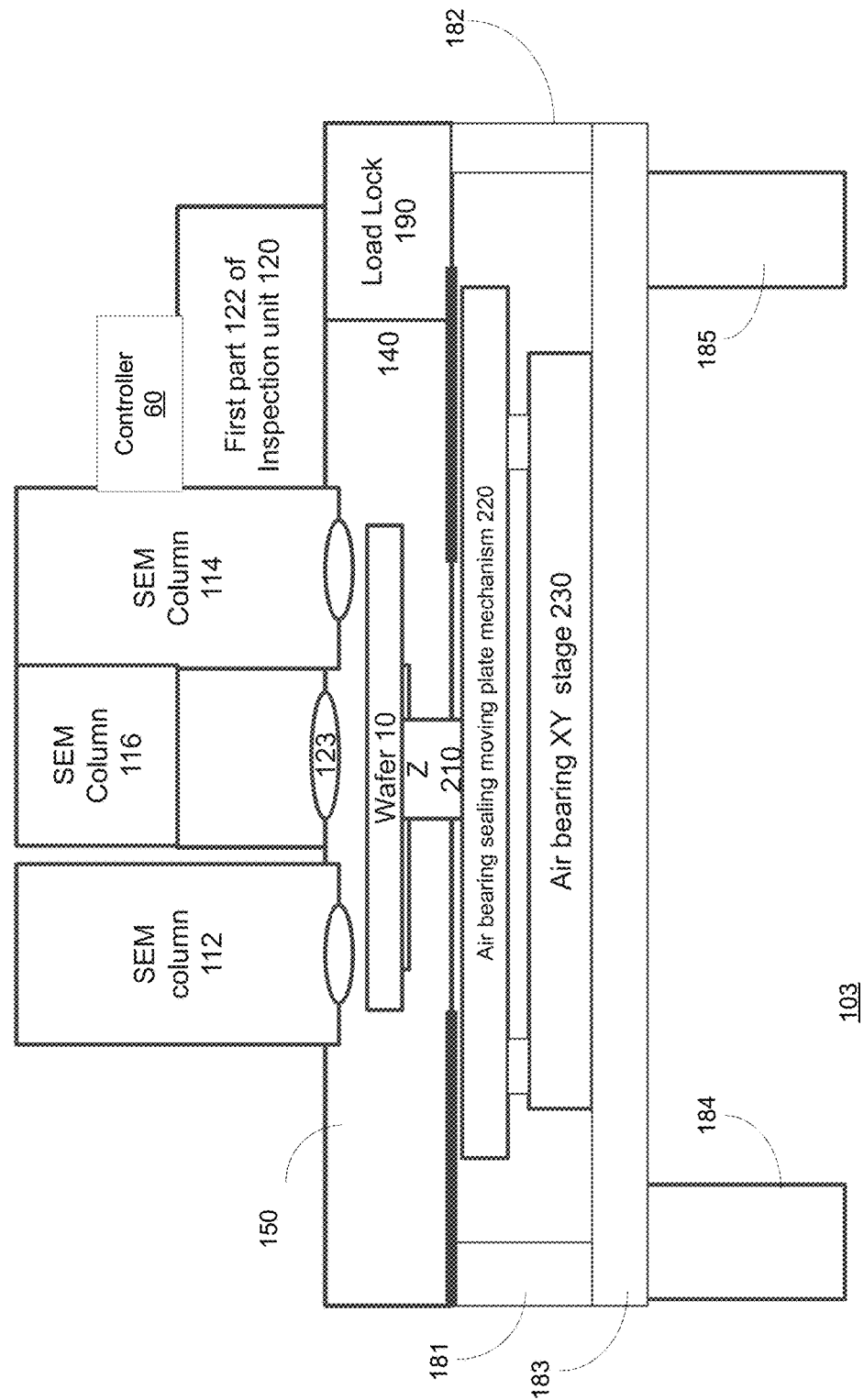
FIG. 9 illustrates a system according to an embodiment of the invention.

FIG. 9 illustrates a sample that is a wafer 10 and a system 103 according to an embodiment of the invention.

System 103 of FIG. 9 differs from system 101 of FIG. 3 by including three SEM columns 112, 114 and 116 instead of having two SEM columns 112 and 114.

Third SEM column 116 is illustrated as being positioned behind the first part 122 of inspection unit 120.

FIGS. 10-16 illustrates various arrangements of SEM columns of review units and of objective lenses of inspection units according to various embodiments of the invention.

FIG. 10 illustrates an objective lens 123 that is positioned between SEM columns 112 and 114 along an imaginary line that is normal to scan line 20'.

FIG. 11 illustrates an objective lens 123 that is positioned between SEM columns 112 and 114 along an imaginary line that is parallel to scan line 20'.

FIG. 12 illustrates an objective lens 123 that is positioned between SEM columns 112 and 114 to form an imaginary symmetrical triangle.

FIG. 13 illustrates an objective lens 123 that is positioned between SEM columns 112 and 114 to form an imaginary asymmetrical triangle.

FIG. 14 illustrates an objective lens 123 that is positioned between SEM columns 112, 112', 114 and 114' to form an imaginary cross.

FIG. 15 illustrates an objective lens 123 that is positioned between SEM columns 112, 112' and 114.

FIG. 16 illustrates an objective lens 123 and a single SEM column 112.

It is noted that the number of objective lenses may exceed one, that the number of SEM columns may exceed one and that any arrangements of SEM columns and objective lenses may be provided.

It is further noted that the objective lens may be replaced by any other optical components of the inspection unit.

Figure 17:
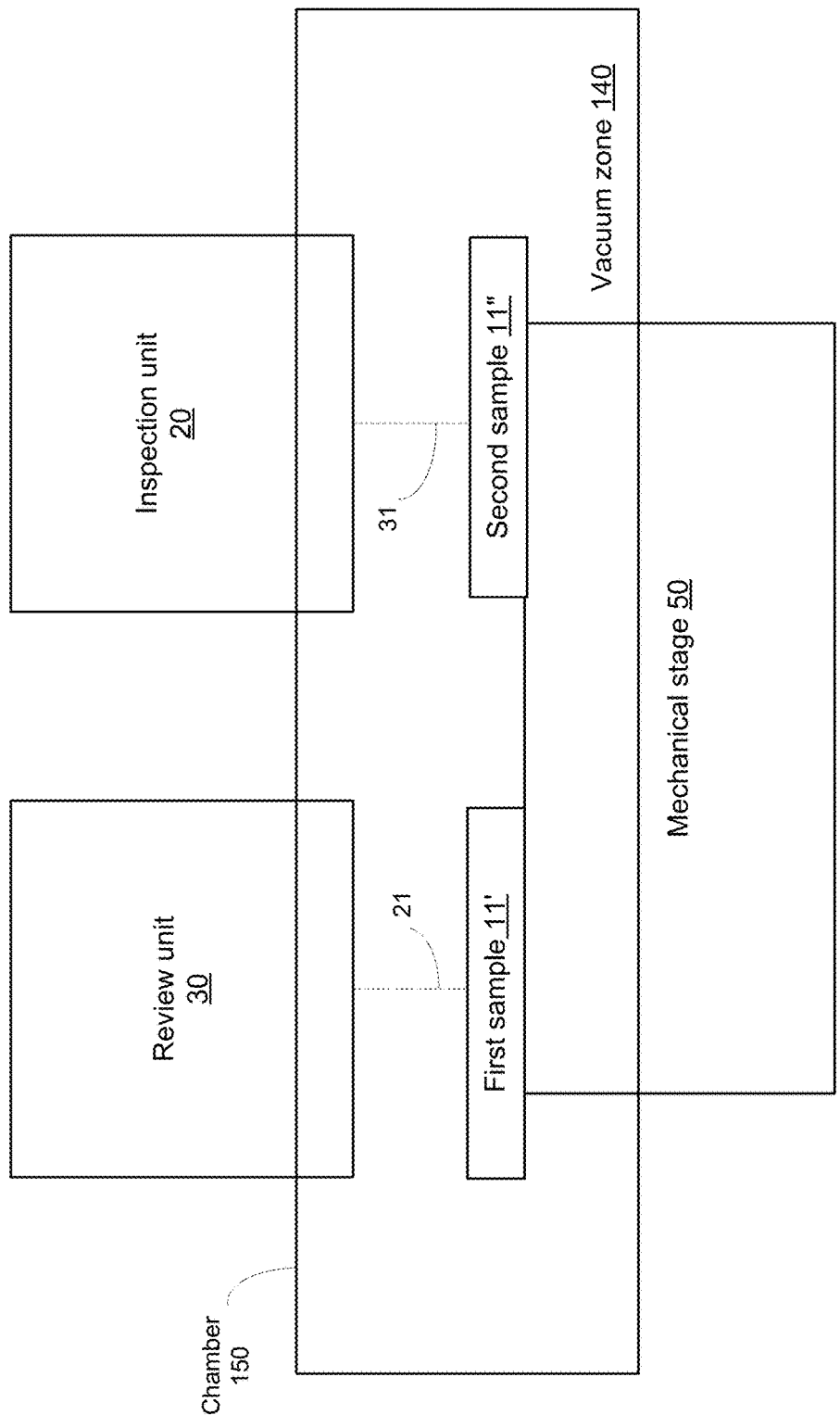
FIG. 17 illustrates a system according to an embodiment of the invention.

FIG. 17 illustrates system 104 according to an embodiment of the invention.

System 104 of FIG. 17 differs from system 100 of FIG. 1 by having two samples (first sample 11' and second sample 11") within a vacuum zone 140 provided within chamber 150. Both first samples 11' and second samples 11" are supported by mechanical stage 50. Instead of having both inspection unit 20 and review unit 30 scanning a same sample—in system 104 the inspection unit 20 scans second sample 11" and review unit 30 scans first sample 11' (after the first sample 11' was scanned by the inspection unit 20 to locate suspected defects).

Figure 18:
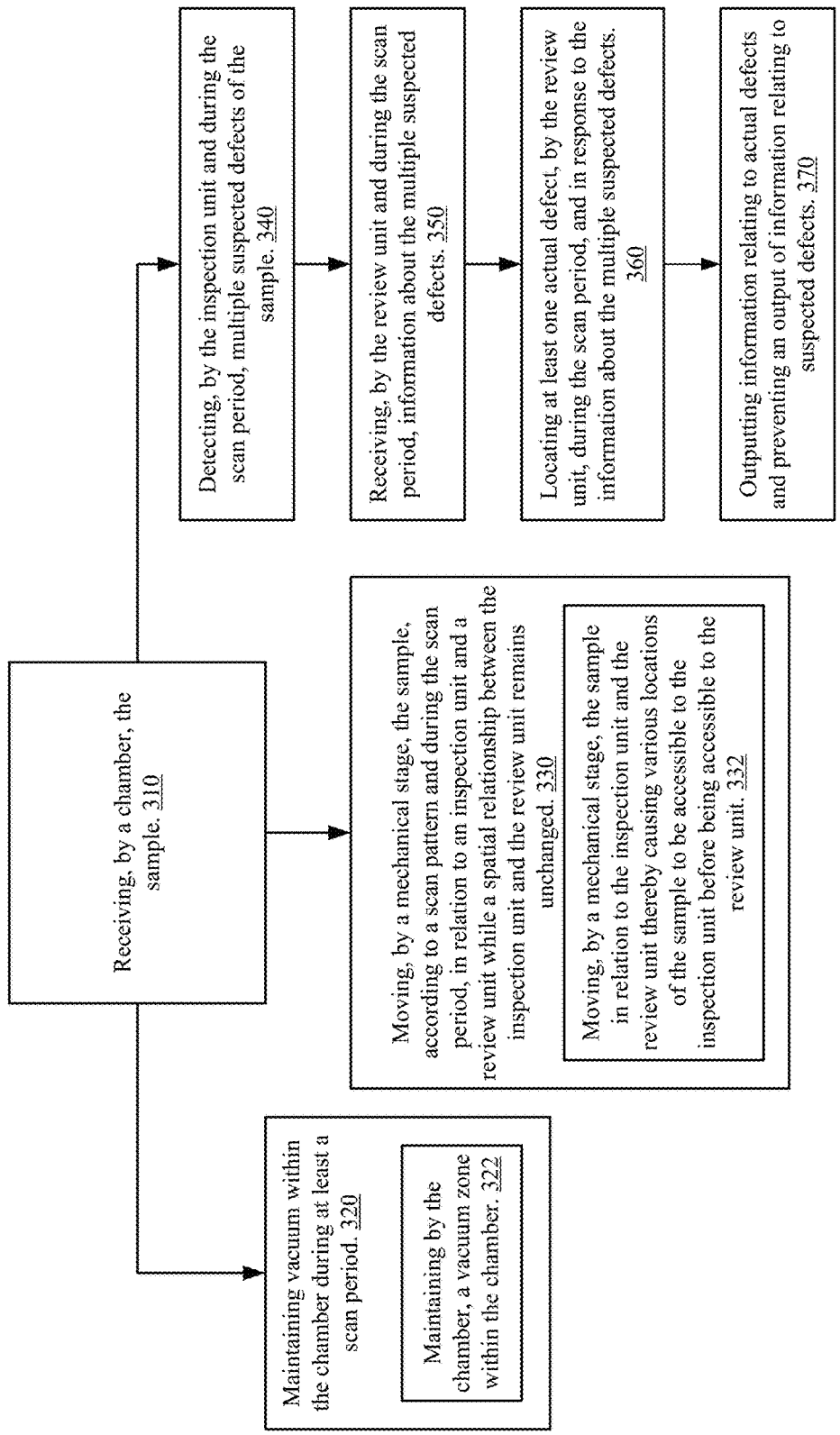
FIG. 18 illustrates a method according to an embodiment of the invention.

FIG. 18 illustrates method 300 for inspecting and reviewing a sample according to an embodiment of the invention.

FIG. 19 illustrates various steps included in step 340 of method 300 according to an embodiment of the invention.

FIG. 20 illustrates various steps included in step 360 of method 300 according to an embodiment of the invention.

Method 300 may start by step 310 of receiving, by a chamber, the sample.

Step 310 may be followed by steps 320, 330 and 340.

Step 320 may include maintaining vacuum within the chamber during at least a scan period.

Step 320 may include maintaining (322) by the chamber, a vacuum zone within the chamber.

Step 330 may include moving, by a mechanical stage, the sample, according to a scan pattern and during the scan period, in relation to an inspection unit and a review unit while a spatial relationship between the inspection unit and the review unit remains unchanged.

Step 330 may include moving (332), by a mechanical stage, the sample in relation to the inspection unit and the review unit thereby causing various locations of the sample to be accessible to the inspection unit before being accessible to the review unit.

Step 340 may include detecting, by the inspection unit and during the scan period, multiple suspected defects of the sample.

Step 340 may include at least one of the following steps:
- a. Scanning (341) the sample by an optical beam, by optics of the inspection unit and during the scan period.
- b. Illuminating (342) by the inspection unit the sample by a first beam that propagates through the vacuum zone. The first beam may be a light beam.
- c. Directing (343) by the illumination module a light beam towards A beam splitter when operating in a bright field operational mode.
- d. Directing (344) by the illumination module a light beam through a window and towards a dark field deflector when operating in a dark field operational mode.
- e. Receiving (345), by the objective lens, a light beam from a beam splitter and directing the light beam towards the sample.
- f. Directing (346), by the objective lens, light emitted from the sample through a beam splitter and towards a light sensor.
- g. Scanning (347), by the inspection unit, the sample in compliance with the scan pattern.
- h. Illuminating (348), by the inspection unit, the sample, during the scan period, with beams; wherein each of the beam propagates at least partially through a single vacuum zone maintained in the chamber, wherein the sample is located in the single vacuum zone.

Step 340 may be followed by step 350 of receiving, by the review unit and during the scan period, information about the multiple suspected defects.

Step 350 may be followed by step 360 of locating at least one actual defect, by the review unit, during the scan period, and in response to the information about the multiple suspected defects.

Step 360 may include at least one of the following steps:
- a. Scanning (361) the sample by a charged particle beam, by a column of the review unit and during the scan period.

b. Illuminating (362), by the review unit, the sample by a second beam that propagates through the vacuum zone. The second beam may be a charged particle beam such as an electron beam and/or an ion beam.

c. Scanning (363) by the column a location of a certain suspected defect out of the multiple suspected defects by deflecting the charged particle beam and at least partially countering the scan pattern.

d. Scanning (364) the sample during the scan period by multiple changed particle beams generated by the review unit and the inspection unit.

e. Scanning (365) by each column of multiple columns of the review unit the sample during the scan period with a charged particle beam.

f. Scanning (366), by the review unit, areas of the sample that may include at least a part of the multiple suspected defects while deviating from the scan pattern.

g. Reviewing (367), by at least one scanning electron microscope (SEM) column of the review unit, the sample at locations of interest on a scanning line which was previously scanned by the inspection unit.

h. Illuminating (368), by the review unit, the sample, during the scan period, with beams; wherein each of the beam propagates at least partially through a single vacuum zone maintained in the chamber, wherein the sample is located in the single vacuum zone.

i. Following (369) the review scheme to detect the at least one actual defect.

j. Scanning (361'), by the review unit, an area of a suspected defect by deviating from one of the parallel scan lines of a scan pattern. 361' k. Scanning (362'), by the review unit, an area of a suspected defect by deflecting a charged particle beam along one of parallel scan lines of a scan pattern.

l. Reviewing (363'), by the review unit, the sample while the inspection unit inspects the sample.

m. Reviewing (364') by the review unit at least one suspected defect while the inspection unit searches for another suspected defect.

n. Determining (365'), by the review unit, a review scheme in response to a scan pattern and to information about the multiple suspected defects.

o. Determining (366'), by a controller, a review scheme in response to a scan pattern and to information about the multiple suspected defects.

p. Selecting (367') a subset of the multiple suspected defects to be reviewed by the review unit.

q. Selecting (368') the subset in response to design data of the sample.

Steps 340, 350 and 360 may be executed in an iterative or partially overlapping manner. For example—the inspection unit can detect one set of suspected defects and the review unit may review at least some of the suspected defects of the set while the inspection unit already detects another set of suspected defects—and all during the scan period.

Accordingly—the locating of the at least one actual defect, by the review unit, can include reviewing at least one suspected defect of the multiple defects while the inspection unit searches for another suspected defect.

During steps 340 and 360 there can be maintained a fixed relationship between a coordinate method of the inspection unit and a coordinate method of the review unit.

Figure 21:
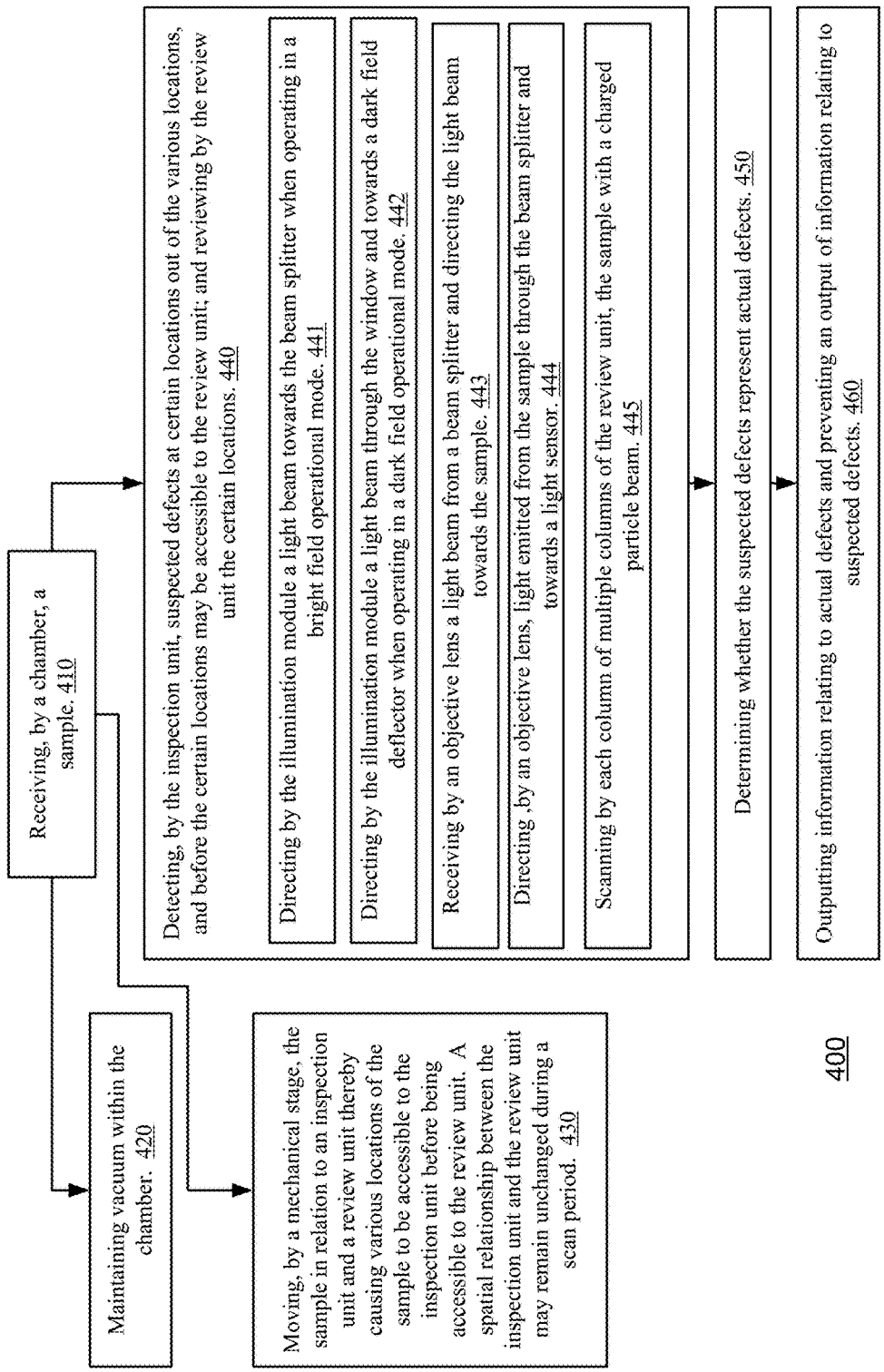
FIG. 21 illustrates a method according to an embodiment of the invention.

FIG. 21 illustrates method 400 according to an embodiment of the invention.

Method 400 may start by step 410 of receiving, by a chamber, a sample.

Step 410 may be followed by steps 420, 430 and 440.

Step 420 may include maintaining vacuum within the chamber.

Step 430 may include moving, by a mechanical stage, the sample in relation to an inspection unit and a review unit thereby causing various locations of the sample to be accessible to the inspection unit before being accessible to the review unit. A spatial relationship between the inspection unit and the review unit may remain unchanged during a scan period.

Step 440 may include detecting, by the inspection unit, suspected defects at certain locations out of the various locations, and before the certain locations may be accessible to the review unit; and reviewing by the review unit the certain locations.

Step 440 may include at least some of the following steps:

a. Step 441 of directing by the illumination module a light beam towards the beam splitter when operating in a bright field operational mode.

b. Step 442 of directing by the illumination module a light beam through the window and towards a dark field deflector when operating in a dark field operational mode.

c. Step 443 of receiving by an objective lens a light beam from a beam splitter and directing the light beam towards the sample.

d. Step 444 of directing, by an objective lens, light emitted from the sample through the beam splitter and towards a light sensor.

e. Step 445 of scanning by each column of multiple columns of the review unit, the sample with a charged particle beam.

Step 440 may be followed by step 450 of determining whether the suspected defects represent actual defects.

Step 450 may be followed by step 460 of outputting information relating to actual defects and preventing an output of information relating to suspected defects.

Figure 22:
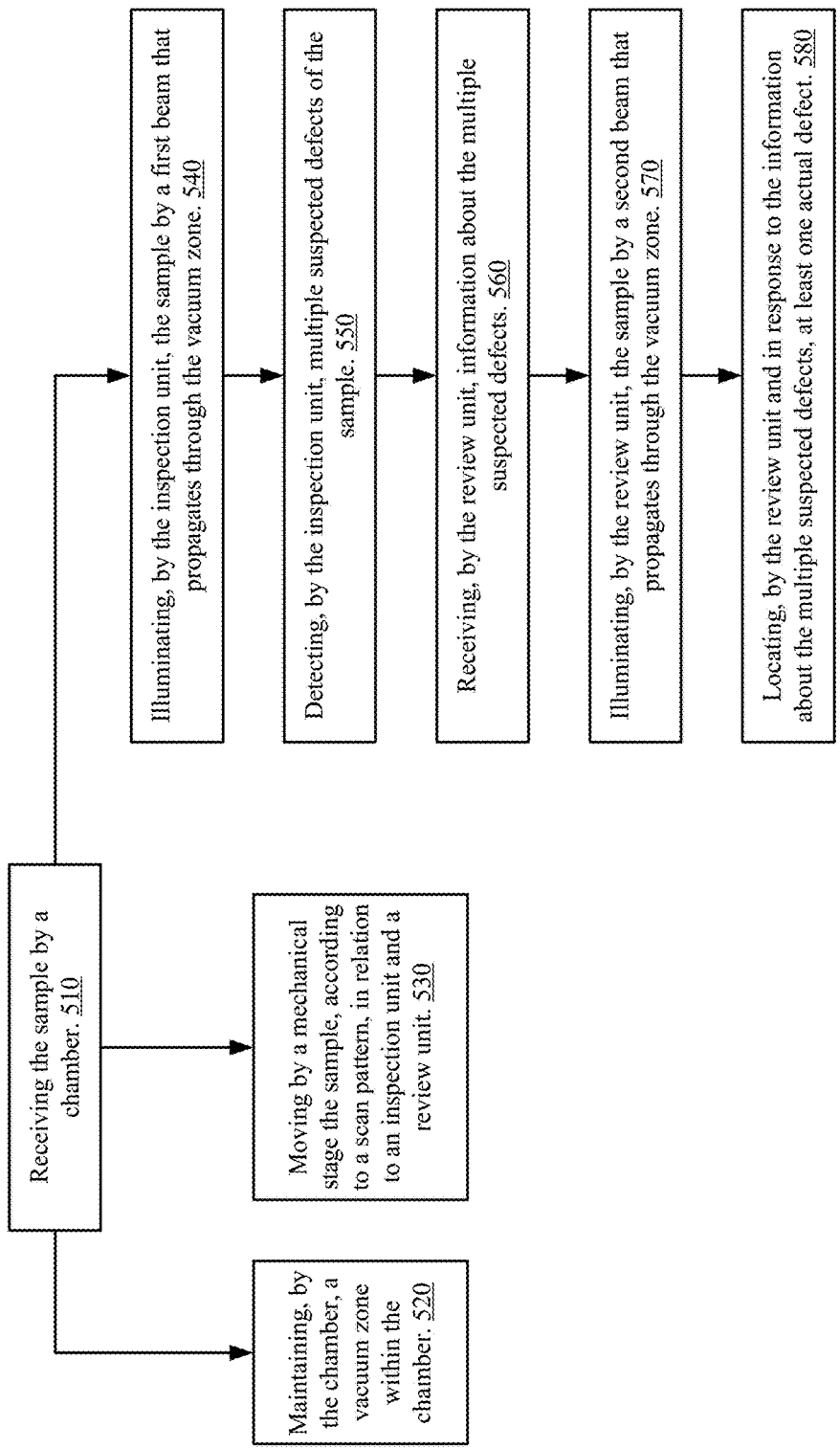
FIG. 22 illustrates a method according to an embodiment of the invention.

FIG. 22 illustrates method 500 according to an embodiment of the invention.

Method 500 may start by step 510 of receiving, by a chamber, a sample.

Step 510 may be followed by steps 520, 530 and 540.

Step 520 may include maintaining, by the chamber, a vacuum zone within the chamber.

Step 530 may include moving by a mechanical stage the sample, according to a scan pattern, in relation to an inspection unit and a review unit.

Step 540 may include illuminating, by the inspection unit, the sample by a first beam that propagates through the vacuum zone.

Step 540 may be followed by step 550 of detecting, by the inspection unit, multiple suspected defects of the sample.

Step 550 may be followed by step 560 of receiving, by the review unit, information about the multiple suspected defects.

Step 560 may be followed by step 570 of illuminating, by the review unit, the sample by a second beam that propagates through the vacuum zone.

Step 570 may be followed by step 580 of locating, by the review unit and in response to the information about the multiple suspected defects, at least one actual defect.

Figure 23:
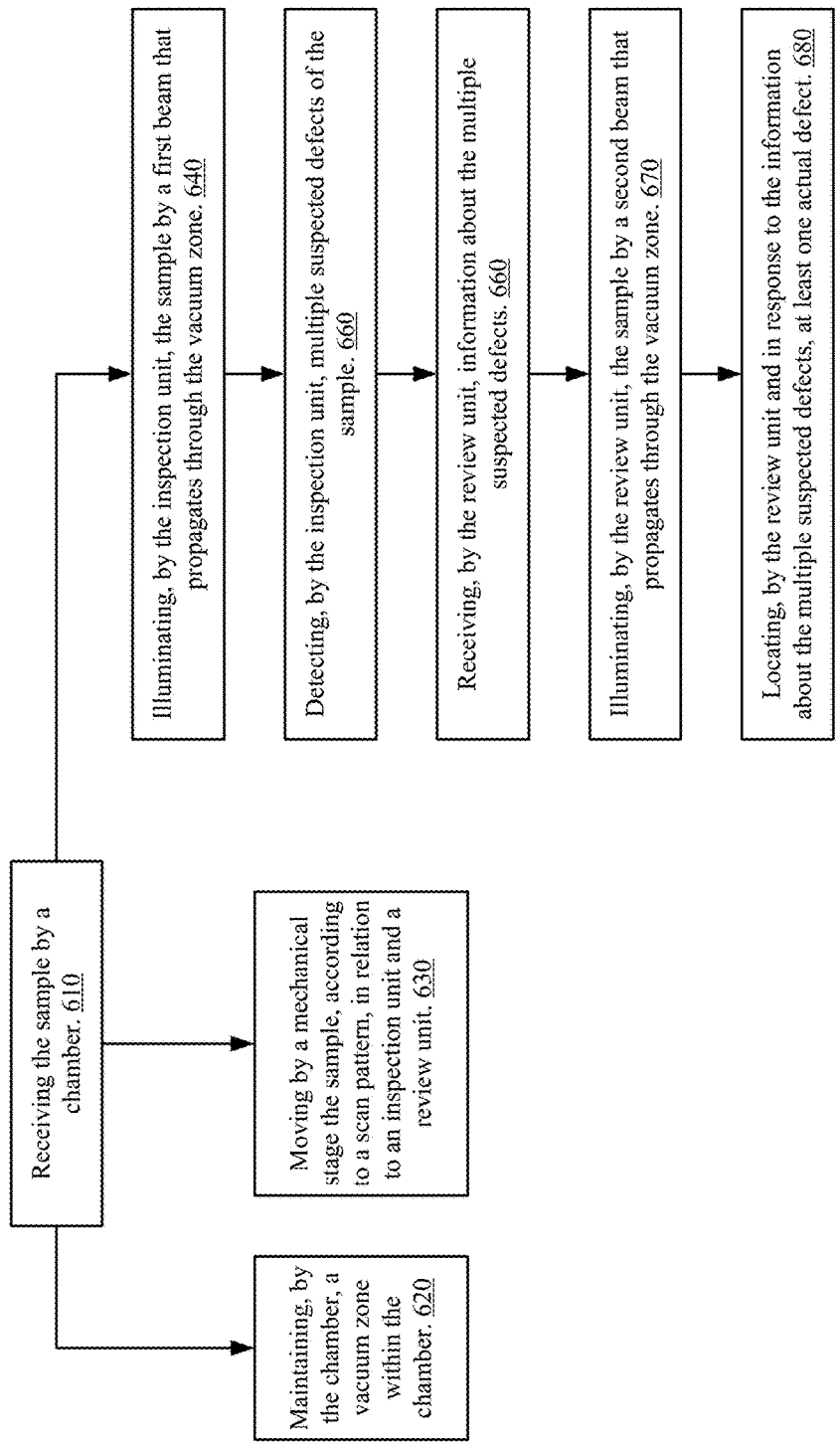
FIG. 23 illustrates a method according to an embodiment of the invention.

FIG. 23 illustrates method 600 according to an embodiment of the invention.

Method 600 may start by step 610 of receiving, by a chamber, a sample.

Step 610 may be followed by steps 620, 630 and 640.

Step 620 may include maintaining vacuum within the chamber.

Step 630 may include moving, by a mechanical stage, the sample, according to a scan pattern, in relation to an inspection unit and a review unit. A fixed relationship is maintained between a coordinate method of the inspection unit and a coordinate method of the review unit.

Step 640 may include detecting, by the inspection unit and during a scan period, multiple suspected defects of the sample.

Step 640 may be followed by step 650 of receiving, by the review unit and during the scan period, information about the multiple suspected defects.

Step 650 may be followed by step 660 of locating at least one actual defect, by the review unit, during the scan period, and in response to the information about the multiple suspected defects.

Figure 24:
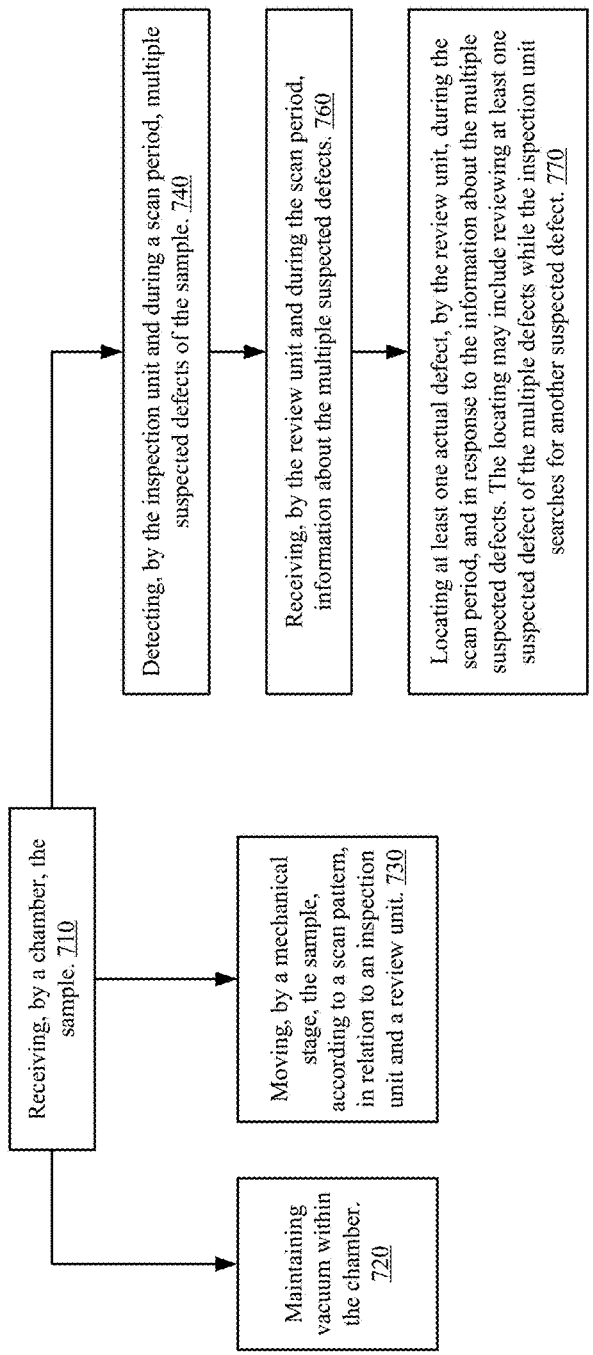
FIG. 24 illustrates a method according to an embodiment of the invention.

FIG. 24 illustrates method 700 according to an embodiment of the invention.

Method 700 may start by step 710 of receiving, by a chamber, a sample.

Step 710 may be followed by steps 720, 730 and 740.

Step 720 may include maintaining vacuum within the chamber.

Step 730 may include moving, by a mechanical stage, the sample, according to a scan pattern, in relation to an inspection unit and a review unit.

Step 740 may include detecting, by the inspection unit and during a scan period, multiple suspected defects of the sample.

Step 740 may be followed by step 750 of receiving, by the review unit and during the scan period, information about the multiple suspected defects.

Step 750 may be followed by step 760 of Locating at least one actual defect, by the review unit, during the scan period, and in response to the information about the multiple suspected defects. The locating may include reviewing at least one suspected defect of the multiple defects while the inspection unit searches for another suspected defect.

Any combination of any steps of any one of method 300, 400, 500, 600 and 700 may be provided.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system for inspecting and reviewing a sample, the system comprising:
    a controller;
    a chamber that is arranged to receive the sample and to maintain vacuum within the chamber during at least a scan period;
    an inspection unit communicatively coupled to the controller, the inspection unit arranged to detect, during the scan period, multiple suspected defects of the sample in the chamber;
    a review unit communicatively coupled to the controller, the review unit arranged to: (i) receive, during the scan period, information about the multiple suspected defects detected by the inspection unit, and (ii) locate, during the scan period and in response to the information about the multiple suspected defects, at least one actual defect of the sample in the chamber; and
    a mechanical stage communicatively coupled to and controlled by the controller to move the sample in the chamber, according to a scan pattern and during the scan period, in relation to the inspection unit and the review unit,
    wherein a spatial relationship between the inspection unit and the review unit remains unchanged during the scan period;
    wherein the scan pattern includes a plurality of parallel scan lines;
    wherein the review unit includes one or more columns, and wherein the inspection unit and at least one of the one or more columns are arranged along a line that is nonparallel to the plurality of parallel scan lines; and
    wherein the one or more columns are operable to review, while the sample is moved by the mechanical stage according to the scan pattern, the suspected defects detected by the inspection unit according to a review scheme dynamically determined by the controller based on the scan pattern and information about the suspected defects detected by the inspection unit.

2. The system according to claim 1 wherein the inspection unit comprises optics that are arranged to scan the sample during the scan period with a photon beam and a column from the one or more columns of the review unit is arranged to scan the sample during the scan period with a charged particle beam.

3. The system according to claim 2 wherein the column is arranged to scan a location of a certain suspected defect out of the multiple suspected defects by deflecting the charged particle beam and at least partially countering the scan pattern.

4. The system according to claim 2 wherein at least a portion of the column and at least a portion of the optics are positioned within the chamber.

5. The system according to claim 1 wherein the inspection unit and the review unit are arranged to scan the sample during the scan period with charged particle beams.

6. The system according to claim 1 wherein each column of the one or more columns is arranged to scan the sample during the scan period with a charged particle beam.

7. The system according to claim 6 wherein the inspection unit comprises optics that are arranged to scan the sample during the scan period with a photon beam.

8. The system according to claim 1 wherein the system further comprises an interface that is arranged to output information related to actual defects.

9. The system according to claim 1 wherein:
    the inspection unit comprises an objective lens, an illumination module, a dark field deflector, a beam splitter and a light sensor;
    the chamber comprises a window and an opening;
    the objective lens is positioned within the opening;
    the illumination module, the beam splitter and light sensor are positioned outside the chamber;
    the dark field deflector is positioned within the chamber;
    the illumination module is arranged to: (i) direct a light beam towards the beam splitter when operating in a bright field operational mode, and (ii) direct a light beam through the window and towards the dark field deflector when operating in a dark field operational mode; and
    the objective lens is arranged to: (i) receive a light beam from the beam splitter and direct the light beam towards the sample, and (ii) direct light emitted from the sample through the beam splitter and towards a light sensor.

10. The system according to claim 1 wherein a distance between an optical axis of the inspection unit and an optical axis of the review unit does not exceed a diameter of the sample.

11. The system according to claim 1 wherein a distance between an optical axis of the inspection unit and an optical axis of the review unit exceeds a diameter of the sample.

12. The system according to claim 1 wherein a distance between an optical axis of the inspection unit and an optical axis of the review unit does not exceed 40 centimeters.

13. The system according to claim 1 wherein the inspection unit is arranged to scan the sample in compliance with the scan pattern and the review unit is arranged to scan areas of the sample that comprise at least a part of the multiple suspected defects while deviating from the scan pattern.

14. The system according to claim 1 wherein the review unit comprises at least one scanning electron microscope (SEM) column that is positioned with respect to the inspection unit such that the at least one SEM column is operable to review the sample at locations of interest on a scanning line which was previously scanned by the inspection unit.

15. The system according to claim 1, wherein the review unit comprises two columns, the inspection unit and the two columns positioned on three vertices of a triangle.

16. The system according to claim 1, wherein the review scheme is further determined based on arrangement of the one or more columns.

17. A method for inspecting and reviewing a sample, the method comprising:
- receiving, by a chamber, the sample;
- maintaining vacuum within the chamber during at least a scan period;
- moving, by a mechanical stage communicatively coupled to and controlled by a controller, the sample in the chamber, according to a scan pattern and during the scan period, in relation to an inspection unit and a review unit, wherein a spatial relationship between the inspection unit and the review unit remains unchanged during the scan period, and wherein the scan pattern includes a plurality of parallel scan lines;
- detecting, by the inspection unit and during the scan period, multiple suspected defects of the sample in the chamber;
- receiving, by the review unit and during the scan period, information about the multiple suspected defects; and
- locating at least one actual defect of the sample in the chamber, by the review unit and the controller, during the scan period, and in response to the information about the multiple suspected defects, wherein the review unit includes one or more columns, and wherein the inspection unit and at least one of the one or more columns are arranged along a line that is nonparallel to the plurality of parallel scan lines such that the one or more columns are operable to review, while the sample is moved by the mechanical stage according to the scan pattern, the suspected defects detected by the inspection unit according to a review scheme dynamically determined by the controller based on the scan pattern, information about the suspected defects detected by the inspection unit, and arrangement of the one or more columns.

18. The method according to claim 17 further comprising:
- outputting information related to the at least one actual defect.

19. A system for inspecting and reviewing a sample, the system comprising:
- a controller;
- a chamber defining a substrate processing zone;
- a vacuum system operatively coupled to the chamber to maintain vacuum within the chamber during a scan period;
- a mechanical stage communicatively coupled to the controller and configured to support and move the sample within the substrate processing zone of the chamber during the scan period according to a scan pattern controlled by the controller, the scan pattern including a plurality of parallel scan lines;
- an inspection unit comprising optics arranged to scan the sample during the scan period with a photon beam, the inspection unit coupled to the chamber, communicatively coupled to the controller, and arranged to detect, during the scan period, suspected defects of the sample; and
- a review unit coupled to the chamber such that a spatial relationship between the inspection unit and the review unit remains unchanged during the scan period, the review unit communicatively coupled to the controller to receive information about the suspected defects detected by the inspection unit, the review unit comprising a scanning electron microscope (SEM) column and operable to review the suspected defects detected by the inspection unit according to a review scheme dynamically determined by the controller based on the scan pattern and information about the suspected defects detected by the inspection unit while the sample is moved by the mechanical stage according to the scan pattern, wherein the SEM column and the inspection unit are arranged along a line that is nonparallel to the plurality of parallel scan lines.

* * * * *